(12) United States Patent
Yamamoto et al.

(10) Patent No.: US 8,062,474 B2
(45) Date of Patent: Nov. 22, 2011

(54) PROTECTIVE TAPE SEPARATION METHOD AND APPARATUS USING THE SAME

(75) Inventors: Masayuki Yamamoto, Ibaraki (JP); Saburo Miyamoto, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 170 days.

(21) Appl. No.: 12/234,292

(22) Filed: Sep. 19, 2008

(65) Prior Publication Data

US 2009/0090451 A1   Apr. 9, 2009

(30) Foreign Application Priority Data

Oct. 4, 2007   (JP) ................. 2007-260866

(51) Int. Cl.
*B32B 38/10*   (2006.01)
(52) U.S. Cl. ........................ 156/702; 156/751
(58) Field of Classification Search ................ 156/344, 156/702, 751
See application file for complete search history.

(56) References Cited

U.S. PATENT DOCUMENTS

| | | | | |
|---|---|---|---|---|
| 2002/0173229 A1* | 11/2002 | Kobayashi | ......... | 451/5 |
| 2006/0219359 A1* | 10/2006 | Miyamoto et al. | ......... | 156/344 |
| 2007/0119543 A1* | 5/2007 | Ametani | ......... | 156/344 |
| 2007/0207629 A1* | 9/2007 | Ametani | ......... | 438/800 |
| 2007/0284038 A1* | 12/2007 | Yamamoto et al. | ......... | 156/297 |

FOREIGN PATENT DOCUMENTS

| | | | |
|---|---|---|---|
| JP | 02125440 A | * | 5/1990 |
| JP | 05-063077 A | | 3/1993 |

OTHER PUBLICATIONS

The First Office Action for the Applicatin No. 200810148856.8 from the State Intellectual Property Office of People's Republic of China dated Aug. 8, 2011.

* cited by examiner

*Primary Examiner* — Khanh P Nguyen
*Assistant Examiner* — John Blades
(74) *Attorney, Agent, or Firm* — Cheng Law Group, PLLC

(57) ABSTRACT

A surface height of a protective tape joined to a wafer mounted and held on a separation table is detected, a lowering operation distance of a needle is calculated based on such detected information, and a lowering operation amount for approaching a joining member to the protective tape until the separation tape winded around the joining member contacts the protective tape is calculated. A separating site is formed in the protective tape and the protective tape is separated while controlling a height of each member based on the calculated lowering operation amount.

27 Claims, 17 Drawing Sheets

PROTECTIVE TAPE SEPARATION METHOD AND APPARATUS USING THE SAME

BACKGROUND OF THE INVENTION

(1) Field of the Invention

The present invention relates to a protective tape separation method for joining a separation tape to a surface of a protective tape joined to a surface of a semiconductor wafer while pressing a non-adhesion surface of the separation tape with a joining member and separating the separation tape, thereby separating the protective tape from the surface of the semiconductor wafer integrally with the separation. The present invention also relates to an apparatus using the method.

(2) Description of the Related Art

A semiconductor wafer (hereinafter, simply referred to as "wafer") is thinned by processing by using a mechanical method such as grinding or polishing, or a chemical method using etching. At the time of processing the wafer by using any of the methods, a protective tape is joined to a surface of the wafer to protect the surface on which a wiring pattern is formed. The wafer to which the protective tape is joined and which is grinded is adhered and held from a back side thereof to a ring frame by way of a dicing tape. The protective tape is then separated and removed from the surface of the wafer held by the ring frame.

As a method for separating and removing the protective tape, there is known a method for joining the separation tape to the surface of the protective tape with a roller-shaped joining member, and separating the separation tape, thereby separating and removing to wind the protective tape integrally from the surface of the wafer (see e.g., Japanese Laid-Open Patent Publication No. 5-63077).

The above-mentioned conventional protective tape separation method, however, has the following problems.

In a case where adherence of the protective tape with respect to the wafer is higher, it becomes difficult to form at a peripheral edge of the wafer a fold-back site that serves as a start of separating the protective tape even when the separation tape joined to the protective tape is separated. The protective tape thus cannot be separated.

Furthermore, a cut plane of the protective tape cut in a protective tape cutting step is an inclined surface (trapezoidal) of which width becomes wider from the surface of the protective tape towards an adhesion surface of the wafer. Thus, it becomes difficult to adhere the separation tape to the peripheral edge of the protective tape, whereby a separation stress is less likely to be applied during separation and separation cannot be carried out with satisfactory precision.

Tight adherence of the separation tape to the peripheral edge of the protective tape can be realized by strongly pressing the separation tape with the roller-shaped joining member. However, the wafer processed to be thin may be damaged in a case where the pressing force is increased.

SUMMARY OF THE INVENTION

It is a main object of the present invention to provide a protective tape separation method for separating a protective tape integrally with a separation tape accurately without damaging a semiconductor wafer by joining the separation tape to the protective tape joined to a surface of the semiconductor wafer and separating the separation, as well as an apparatus using the method.

In order to form the fold-back site (separating site) that serves as the start of separating the protective tape, the inventors have performed experiments of working a separation member having a sharp tip at the peripheral edge of the protective tape without touching the wafer, forming a separating site by separating one part of the protective tape in advance, and thereafter joining the separation tape to the protective tape and separating the protective tape from the separating site as a starting point. According to this experiment, it was found that the separation precision of the protective tape could be improved.

However, it was also found that a new problem as described below arose when the separation member worked on the end of the protective tape. That is to say, when the tip is hooked to or pierced through the protective tape as an action of the separation member, the wafer was damaged under the pressing force thereof, etc.

In order to solve this problem, the inventors have made through review, and repeatedly performed the experiments of separating the protective tape focusing on the height of the separation member to work on the protective tape according to the surface height of the protective tape and the like, and the height of the joining member when joining the separation tape to the protective tape. As a result, it was found that the protective tape can be accurately separated integrally with the separation tape without damaging the wafer by individually controlling the heights of such members according to conditions in time of protective tape separation.

In order to achieve the above object, the invention employs the following configuration.

According to a defect position detection method of a semiconductor wafer of the present invention, there is provided a protective tape separation method for separating a protective tape integrally with a separation tape accurately without damaging a semiconductor wafer by joining the separation tape to the protective tape joined to a surface of the semiconductor wafer while pressing a non-adhesion surface of the separation tape with a joining member, and separating the protective tape from the surface of the semiconductor wafer integrally with the separation tape by separating the separation tape, the method including a height detecting step of detecting a separation tape joining start position and a surface height of the protective tape joined to the semiconductor wafer mounted and held on a separation table; a calculating step of calculating a first operation amount of hooking a separation member having a sharp tip to a peripheral edge of the protective tape at the separation tape joining position and moving the separation member until forming a separating site serving as a separation starting point, and a second operation amount of approaching the joining member to the protective tape until the separation tape wound around the joining member contacts the protective tape based on detected information of the surface height of the protective tape; a first separating step of hooking the separation member to the peripheral edge of the protective tape and separating at least one part of a peripheral edge of the protective tape to form the separating site based on the first operation amount; a joining step of joining the separation tape to the protective tape by relatively moving the semiconductor wafer and the joining member along a direction of a surface of the protective tape while pressing the separation tape to the protective tape with the joining member based on the second operation amount after moving backward the separation member which has separated the peripheral edge of the protective tape; and a second separating step of separating the separation tape from the surface of the semiconductor wafer integrally with the protective tape relatively moving the semiconductor wafer and the joining member along the direction of the surface of the protective tape with the separating site as the starting point.

According to the protective tape separation method of the present invention (first invention), each operation amount of the separation member and the joining member to the operating position on the protective tape is calculated by detecting the surface height of the protective tape. The first operation amount of the separation member is calculated as a value obtained by adding the distance from the origin position, perpendicularly down from the standby position, to the periphery of the protective tape and the length of the hooked portion of the tip of the separation member.

The second operation amount of the joining member is calculated as a value obtained by subtracting the acquired surface height of the protective tape and the thickness of the separation tape wound around the joining member from the height of the joining member at the origin position or the standby position. Each operation amount is calculated in such a manner.

The separation member at the original height position is controlled to move by the calculated first operation amount, and then stopped. The peripheral edge of the protective tape joined to the surface of the semiconductor wafer (hereinafter simply referred to as "wafer") is hooked by the tip of the separation member while being applied with a predetermined pressing force in the downward direction. One part of the peripheral edge of the protective tape is then separated according to the surface height of the protective tape.

The joining member at the original position is controlled to approach the protective tape by the second operation amount after the separation member moves backward, and then stops. The separation tape is then contacted to the surface of the protective tape with a predetermined pressing force. When the separation tape is contacted to the surface of the protective tape, the joining member and the separation table are relatively moved along the direction of the surface of the protective tape based on the calculated surface height of the protective tape, thereby the separation tape is joined to the surface of the protective tape.

The joined separation tape is then separated from the separating site of the protective tape separated in the previous step, so that the protective tape joined with the separation tape is separated from the surface of the semiconductor wafer integrally with the separation tape.

As a result, excessive load is not applied on the wafer when forming the separating site serving as the separation starting point of the protective tape. Similarly, the separation tape can be joined to the protective tape without applying excessive load on the semiconductor wafer, and the protective tape and the separation tape can be reliably and smoothly separated from the semiconductor wafer in an integrated manner. That is, the protective tape can be reliably separated without damaging the wafer under the pressing force of each member.

In order to achieve the above object, the present invention adopts the following configuration.

A protective tape separation method for separating a protective tape from a surface of a semiconductor wafer integrally with a separation tape by joining the separation tape to the protective tape joined to the surface of the semiconductor wafer while pressing a non-adhesion surface of the separation tape with a joining member by separating the separation tape, the method including a height detecting step of detecting a separation tape joining start position and a surface height of the protective tape joined to the semiconductor wafer mounted and held on a separation table; a calculating step of calculating a first operation amount of sticking a separation member to a peripheral edge of the protective tape serving as a separation tape joining position and moving the separation member until forming a separating site serving as a separation starting point, and a second operation amount of approaching the joining member to the protective tape until the separation tape wound around the joining member contacts the protective tape based on detected information of the surface height of the protective tape; a first separating step of sticking the separation member to the peripheral edge of the protective tape and separating one part of the peripheral edge of the protective tape to form the separating site based on the first operation amount; a joining step of joining the separation tape to the protective tape by relatively moving the semiconductor wafer and the joining member along a direction of a surface of the protective tape while pressing the separation tape to the protective tape with the joining member based on the second operation amount after evacuating the separation member which has separated the end of the protective tape; and a second separating step of separating the separation tape from the surface of the semiconductor wafer integrally with the protective tape by relatively moving the semiconductor wafer and the joining member along the direction of the surface of the protective tape with the separating site as the starting point.

According to the protective tape separation method of the present invention, each operation amount of the separation member and the joining member to the operating position on the protective tape is calculated by detecting the surface height of the protective tape. The first operation amount of the separation member is calculated as a value obtained by adding the distance from the origin position, perpendicularly down from the standby position, to the periphery of the protective tape and the length of the pierced portion of the tip of the separation member.

The second operation amount of the joining member is calculated as a value obtained by subtracting the acquired surface height of the protective tape and the thickness of the separation tape wound around the joining member from the height of the joining member at the origin position or the standby position. Each operation amount is calculated in such a manner.

The separation member at the original height position is controlled to move by the calculated first operation amount, and then stopped. The tip of the separation member then sticks to the peripheral edge of the protective tape joined to the surface of the semiconductor wafer with a predetermined pressing force, and one part of the peripheral edge of the protective tape is then separated according to the surface height of the protective tape.

The joining member at the original position is controlled to approach the protective tape by the second operation amount after the separation member moves backward, and then stops. The separation tape is then contacted to the surface of the protective tape with a predetermined pressing force. When the separation tape is contacted to the surface of the protective tape, the joining member and the separation table are relatively moved along the direction of the surface of the protective tape based on the calculated surface height of the protective tape, thereby the separation tape is joined to the surface of the protective tape.

The joined separation tape is then separated from the separating site of the protective tape separated in the previous step, so that the protective tape joined with the separation tape is separated from the surface of the semiconductor wafer integrally with the separation tape.

As a result, excessive load is not applied on the wafer when forming the separating site serving as the separation starting point of the protective tape. Similarly, the separation tape can be joined to the protective tape without applying excessive load on the semiconductor wafer, and the protective tape and the separation tape can be reliably and smoothly separated from the semiconductor wafer in an integrated manner. That is, the protective tape can be reliably separated without damaging the wafer under the pressing force of each member.

In both of the above methods, the surface height of the protective tape is preferably calculated in the following manner.

In the height detecting step, an average value of a plurality of detected values in a predetermined range including a wafer edge on a separation tape joining start side of the semiconductor wafer is set as the surface height of the protective tape.

According to this method, the separation tape can be accurately joined to the surface of the protective tape at the start of joining the separation tape, and thus the subsequent separation of the protective tape from the surface of the wafer involved in the separation operation of the separation tape becomes more accurate.

The average value is preferably obtained by measuring a distribution of the surface height from the detected value, and excluding a unique value from the distribution.

According to such a method, the average value of the surface height takes a more even value by excluding the unique value from the distribution of the surface height. The unique values referred to herein include those from concave parts caused by deficit etc. of the protective tape, raised portions due to chipping, attachment of foreign substances, and the like. Excessive load will not be applied on the wafer with the joining member as calculation accuracy of the average value improves by excluding these unique values. As a result, the damages of the wafer can be avoided.

In another embodiment, it is preferable that a deviation between a reference value of the surface height of the protective tape determined in advance and an actual measurement value of the surface height of the protective tape obtained from an actual measurement is obtained, and the operation amounts obtained in the calculating step are corrected according to the deviation.

According to this method, the excessive load is avoided from being applied on the wafer since the operation amount of the joining member is corrected according to the deviation obtained from the reference value and the actual measurement value.

Joining of the separation tape includes the following aspects.

Firstly, the separation tape is joined to an end of the protective tape on the separation tape joining start side, and the separation tape is joined from the end towards a separation tape joining termination side.

According to this aspect, the protective tape can be separated from the surface of the wafer with one separation tape joining operation.

Secondly, the joining member is operated to approach the surface of the protective tape closer to a center of the wafer with respect to the wafer edge on the separation tape joining start side, and join the separation tape towards the wafer edge on the separation tape joining start side while maintaining a height of the joining member; and then the separation tape is joined towards the wafer edge on the separation tape joining termination side while maintaining the height of the joining member.

According to this aspect, the site closer to the center of the wafer with respect to the wafer edge having a beveled portion has higher rigidity than the wafer edge, and thus by having such a site as the separation tape joining start position, it becomes effective in avoiding the semiconductor wafer from being damaged under the first joining pressing force by the joining member.

In the joining aspect, preferably, the calculating step calculates the second operation amount with which the height of the joining member to be contacted to the separating site becomes higher than the height of the non-separating portion of the protective tape; and the joining step performs joining with the pressing force for joining the separation tape to the separating site separated in the second separating step weaker than that to the non-separating portion of the protective tape based on the second operation amount.

According to this method, the separating site of the once separated protective tape is avoided from again closely attaching and adhering to the surface of the wafer when the separation tape is joined to the surface of the protective tape. Therefore, the protective tape can be accurately separated from the separating site as the starting point.

In each method above, the joining step and the second separating step are preferably simultaneously performed.

According to this method, the separation tape wound around the joining member is pressed and contacted to the end edge of the protective tape. Thereafter, the joining and the separation of the separation tape are simultaneously carried out at the contacting location with the relative movement of the wafer and the joining member along the direction of the surface of the protective tape, and the protective tape is sequentially separated from the end edge where the joining of the separation tape started.

In each of the methods above, for example, the separation member is a needle; and the joining member is an edge member with a sharp distal end.

That is, the separation stress can be concentrated by hooking the tip of the needle to one part on the peripheral edge of the protective tape. The separation stress can also be concentrated at the relevant site by sticking the needle to the peripheral edge of the protective tape. That is, one part on the peripheral edge of the protective tape can be reliably separated. The separation tape contacts to the protective tape in a linear form with a small width by using the edge member to join the separation tape, whereby the joining position can be more easily defined.

In order to achieve the above object, the present invention adopts the following configuration.

There is provided a protective tape separation method for separating a protective tape from a surface of a semiconductor wafer integrally with a separation tape by joining the separation tape to the protective tape joined to the surface of the semiconductor wafer while pressing a non-adhesion surface of the separation tape with a joining member and by separating the separation tape, the method including a height detecting step of detecting a separation tape joining start position and a surface height of the protective tape joined to the semiconductor wafer mounted and held on a separation table, and a surface height of an outer peripheral portion of the wafer; a calculating step of calculating a first operation amount of approaching a tapered tip of a separation member of the same extent as a width of the separation tape having difficult-to-adhere property to the side surface of the protective tape at the separation tape joining position based on detected information of the surface height of the protective tape and a thickness of the protective tape obtained in advance, a second operation amount of approaching the tip of the separation member to the outer periphery of the wafer and approaching a bottom surface to the outer peripheral portion thereof based on the surface height of the outer peripheral portion of the wafer, and a third operation amount of approaching the joining member to the protective tape until the separation tape wound around the joining member contacts the protective tape; a first separating step of sticking to an adhesive layer of the protective tape and separating at least one part of a peripheral edge of the protective tape to form a separating site after aligning the separation member based on the first operation amount; a moving step of moving the separation member to the outer peripheral portion of the wafer based on the second operation amount after moving backward the separation member from the separating site; a joining step of joining the separation tape to the protective tape by relatively moving the semiconductor wafer and the joining member along a direction of a surface of the protective tape while pressing the separation tape to the protective tape with the joining member from the separating site side of the protective tape based on the third operation amount; and a second separating step of separating the separation tape from the surface of the semiconductor wafer integrally with the protective tape by relatively moving the semiconductor wafer and the joining member along the direction of the surface of the protective tape with the separating site as a starting point.

According to the protective tape separation method of the present invention (second invention), each operation amount of the separation member to the operating position on the protective tape is calculated from the detected surface height of the protective tape and the thickness of the protective tape. That is, the first operation amount of the separation member is calculated by adding the surface height and the thickness of the protective tape acquired from the height of the origin position or the standby position, and taking into consideration the length of the tip of the separation member so that the tip of the separation member sticks and fits within the thickness portion.

The second operation amount of the separation member is determined as a value smaller than the surface height of the outer peripheral portion of the wafer acquired from the height of the origin position or the standby position.

Furthermore, the third operation amount of the joining member is calculated as a value obtained by subtracting acquired surface height of the protective tape and the thickness of the separation tape wound around the joining member from the height of the joining member at the origin position or the standby position. Each operation amount is calculated in such a manner.

The separation member at the original height position is controlled to move by the calculated first operation amount, and then stopped. The separation member having a sharp tip sticks to the adhesion layer of the protective tape, and one part of the peripheral edge of the protective tape is separated. Since the height of the separation member is controlled, excessive load is not applied by the separation member. Therefore, damaging of the wafer can be avoided.

After the separating process is terminated, the tip of the separation member is approached towards the end of the separating site of the protective tape from the outer side of the peripheral, edge of the wafer based on the second operation amount. Thereafter, the separation tape is joined from the separating site side of the protective tape.

Since the tip of the separation member is brought close towards the separation starting of the protective tape, the separation tape to be joined to the protective tape may bend and run out from the outer periphery of the wafer, thereby the separation tape may drop towards the wafer holding surface. In such a case, the tip of the separation member receives the dropping separation tape. After the joining of the separation tape is terminated, the separation tape is separated from the separating site as the starting point. That is, since the protective tape of the separating site has lower adhesion strength with the wafer, the separation of the protective tape can be started at the relevant site by concentrating the separation stress thereat, and thus the protective tape and the separation tape can be reliably separated integrally.

When the separation tape runs out from the outer periphery of the wafer and drops, the separation tape is received by the tip of the separation member, thereby preventing the adhesion surface of the separation tape from being joined to the holding surface etc. of the member for holding the wafer. For instance, when separating with the separation tape the protective tape joined to the surface of the wafer on the mount frame held at the center of the ring frame by way of the adhesive tape, the adhesion surfaces of the adhesive tape and the separation tape are prevented from joining to each other. Moreover, the damages of the wafer can be avoided since excessive separation stress is not applied on the wafer when separating the protective tape.

The surface height of the protective tape, the joining aspects of the separation tape, the third operation amount, and the like may be applied to a method similar to the first and second inventions.

In order to achieve the above object, the present invention adopts the following configuration.

There is provided a protective tape separation apparatus for separating a protective tape from a surface of a semiconductor wafer integrally with a separation tape by joining the separation tape to the protective tape joined to the surface of the semiconductor wafer while pressing a non-adhesion surface of the separation tape with a joining member and by separating the separation tape, the apparatus including a separation table for mounting and holding the semiconductor wafer with the protective tape; a separation member having a sharp tip directed towards the protective tape joined to the surface of the semiconductor wafer; first lifting driving means for relatively moving the separation member upward and downward with respect to the separation table between an operating position where the tip works at a peripheral edge of the protective tape joined to the semiconductor wafer held on the separation table and a standby position on an upper side of the separation position; separation tape supplying means for winding and supplying the band-shaped separation tape to the joining member; second lifting driving means for relatively moving the joining member upward and downward with respect to the separation table between an operating position of joining the separation tape to the surface of the protective tape joined to the semiconductor wafer held on the separation table and a standby position on an upper side of the operating position; horizontal driving means for relatively moving the separation table and the separation member, and the separation table and the joining member in opposite directions; a detector for detecting a separation tape joining start position and a surface height of the protective tape joined to the semiconductor wafer held on the separation table; calculating means for calculating a first operation amount to the operating position of working the tip of the separation member at the peripheral edge of the protective tape at the separation tape joining start position and forming a separation starting point, and a second operation amount to the operating position of approaching the separation tape wound around the joining member to the protective tape, based on detected information of the surface height of the protective tape; controlling means for controlling the respective driving means so as to lift the separation member to the operating position by the first lifting driving means based on the first operation amount calculated by the calculating means, relatively move the separation member and the separation table at the operating position in opposite directions by the horizontal driving means to separate one part of the peripheral edge of the protective tape, move backward the separation member to a standby position by the first elevation driving means, and thereafter, move the joining member to the operating position by the second lifting driving means, relatively move the joining member and the separation table in opposite directions by the horizontal driving means, and simultaneously separate the separation tape while joining to the protective tape; and tape collecting means for collecting the protective tape integrally with the separated separation tape.

According to the protective tape separation apparatus of the present invention, each operation amount of the separation member and the joining member can be appropriately determined, and the protective tape can be accurately separated from the separating site formed in advance as the starting point while avoiding excessive load from being applied on the wafer. That is, the first and second method inventions can be suitably realized.

In the protective tape separation apparatus, preferably, the separation member of the same extent as a width of the separation tape has difficult-to adhere property and a tapered distal end; the calculating means calculates a third operation amount to the operating position of approaching the tip of the separation member to the outer periphery of the wafer while approaching the bottom surface of the separation member to the outer peripheral portion thereof based on the surface height of the outer peripheral portion of the wafer; and the controlling means forms the separating site in the protective tape with the separation member, and then moves the separation member to the operating position by controlling the horizontal driving means and the first driving means based on the third operation amount.

According to such a configuration, the above methods according to the invention can be suitably realized.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DETAILED DESCRIPTION OF THE PREFERRED EMBODIMENTS

An embodiment of a semiconductor wafer mount apparatus provided with a protective tape separation apparatus of the present invention will be described below with reference to the drawings.

Figure 1:
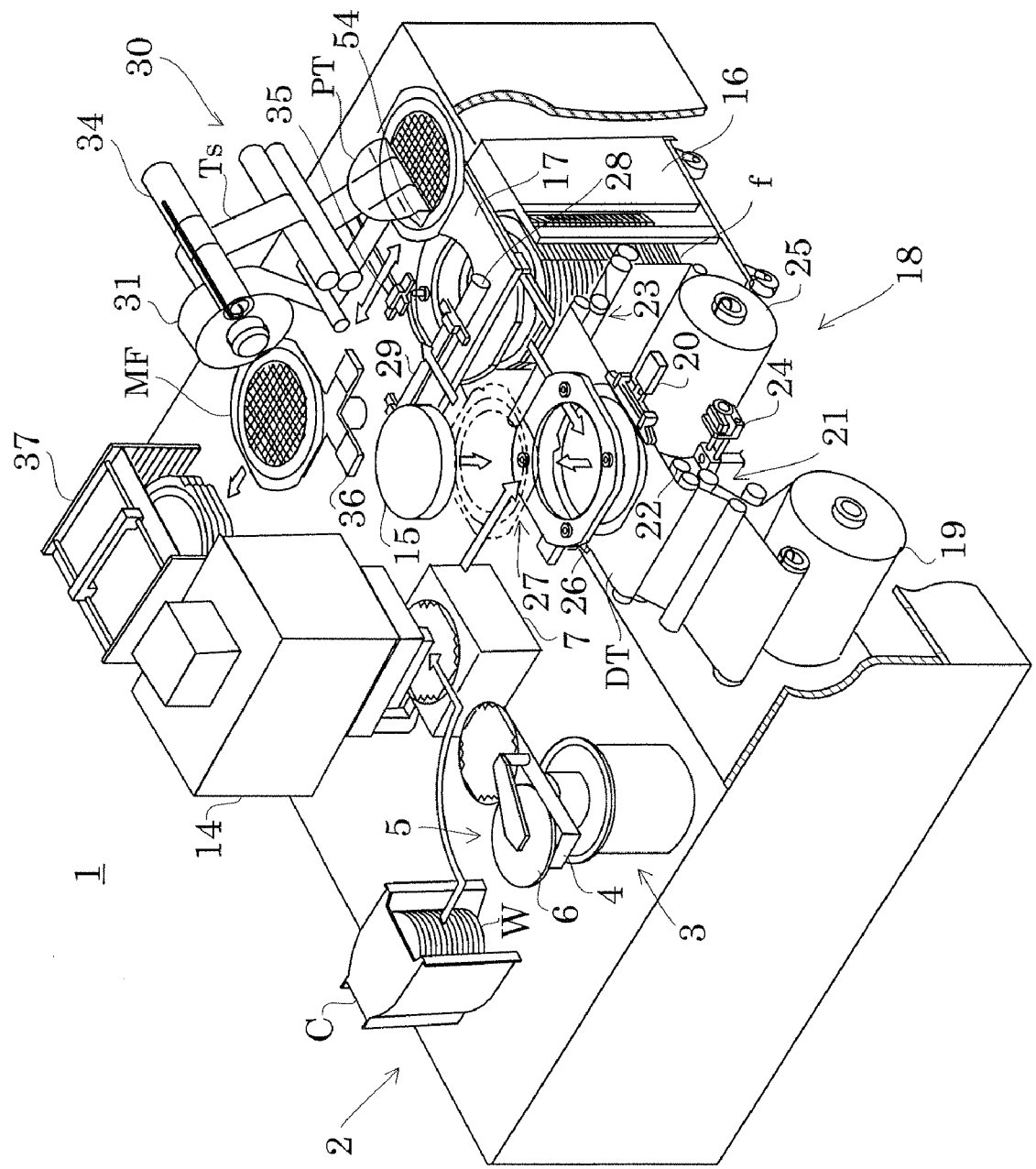
FIG. 1 is a perspective view illustrating a whole semiconductor wafer mount apparatus.

FIG. 1 is a cutaway perspective view illustrating a whole configuration of a semiconductor wafer mount apparatus according to a first embodiment of the invention.

A semiconductor wafer mount apparatus 1 of the present embodiment includes a wafer supply part 2 in which cassettes C for housing wafers W subjected to a back grinding process in multiple stages are loaded, a wafer transport mechanism 3 having a robot arm 4 and a pressing mechanism 5, an alignment stage 7 for aligning the wafer W, an ultraviolet irradiation unit 14 for emitting ultraviolet rays toward the wafer W mounted on the alignment stage 7, a chuck table 15 for sucking and holding the wafer W, a ring frame supply part 16 in which ring frames f are housed in multiple stages, a ring frame transport mechanism 17 for moving to mount the ring frame f onto a supporting adhesive tape DT or a dicing tape, a tape processing part 18 for joining the adhesive tape DT from the back side of the ring frame f, a ring frame lifting mechanism 26 for moving the ring frame f to which the adhesive tape DT is joined in the vertical direction, a mount frame fabrication part 27 for fabricating a mount frame MF integrated by joining the wafer W to the ring frame f to which the adhesive tape DT is joined, a first mount frame transport mechanism 29 for transporting the fabricated mount frame MF, a separation mechanism 30 for separating the protective tape PT joined to the surface of the wafer W, a second mount frame transport mechanism 35 for transporting the mount frame MF from which the protective tape PT is separated by the separation mechanism 30, a turn table 36 for turning and transporting the mount frame MF, and a mount frame collecting part 37 for housing the mount frames MF in multiple stages.

The wafer supply part 2 has a cassette stand (not shown). The cassettes C housing the wafers W, which has a protective tape PT joined to a pattern surface (hereinafter appropriately referred to as "surface"), in multiple stages is mounted on the cassette stand. The wafer W maintains a horizontal posture with its pattern surface facing upward.

The wafer transport mechanism 3 is constructed so as to swing and move in the vertical direction by a driving mechanism (not shown). Specifically, the wafer transport mechanism 3 performs position adjustment of a wafer holder of the robot arm 4 which will be described later and a pressing plate 6 of the pressing mechanism 5, and transports the wafer W from the cassette C to the alignment stage 7.

The robot arm 4 of the wafer transport mechanism 3 has, at its distal end, a wafer holder (not shown) having a horseshoe shape. The robot arm 4 is constructed so that its wafer holder can move forward/rearward in the gaps between the wafers W housed in multiple stages in the cassettes C. The wafer holder at the distal end of the robot arm has a suction hole, and holds the wafer W at the distal end from the back side by vacuum.

The pressing mechanism 5 of the wafer transport mechanism 3 has, at its distal end, the circular pressing plate 6 having almost the same shape as that of the wafer W. The arm portion of the pressing mechanism 5 can move forward/rearward so that the pressing plate 6 is moved above the wafer W mounted on the alignment stage 7. The shape of the pressing plate 6 is not limited to the circular shape but may be any shape as long as a warp which occurs in the wafer W can be corrected. For example, a distal end of a stick or the like may be pressed against a warped portion of the wafer W.

The pressing mechanism 5 operates in a case where poor suction occurs when the wafer W is mounted on a holding table of the alignment stage 7 which will be described later. Concretely, when a warp occurs in the wafer W and the wafer W cannot be suction-held, the pressing plate 6 presses the surface of the wafer W and corrects the warp, so that the surface becomes flat. In this state, a holding table attracts by vacuum the wafer W from the back side.

The alignment stage 7 positions the mounted wafer W based on an orientation flat, a notch, or the like at the peripheral edge of the wafer W. The alignment stage 7 has a holding table for covering and sucking by vacuum the entire back side of the wafer W.

The alignment stage 7 detects a pressure value when the waver W is sucked by vacuum, and compares the pressure value with a reference value which is predetermined in relation to a pressure value in normal operation (when the wafer W is normally sucked by the holding table). If the pressure value is higher than the reference value (that is, when the pressure in an intake pipe is not sufficiently lowered), determination is made that the wafer W is warped and is not sucked by the holding table. The pressing plate 6 is operated to press the wafer W and correct the warp, so that the wafer W can be sucked by the holding table.

The alignment stage 7 can transport the wafer W in a state where it suction-holds the wafer W between an initial position where the wafer W is mounted and positioned and an intermediate position between the chuck table 15 and the ring frame lifting mechanism 26 disposed in multiple stages above the tape processing part 18 which will be described later. That is, the alignment stage 7 transports the wafer W to the next process while correcting the warp of the wafer W and holding the wafer W in a flat state.

The ultraviolet irradiation unit 14 is positioned above the alignment stage 7 in the initial position. The ultraviolet irradiation unit 14 emits ultraviolet rays toward the protective tape PT as an ultraviolet curing adhesive tape joined to the surface of the wafer W. That is, adhesion of the protective tape PT is decreased by irradiation of ultraviolet rays.

The chuck table 15 has a circular shape which is almost the same as that of the wafer W so as to be able to cover and suck by vacuum the surface of the wafer W. The chuck table 15 is configured to move vertically by a driving mechanism (not shown) from a standby position above the tape processing part 18 to a position where the wafer W is joined to the ring frame f.

That is, the chuck table 15 comes into contact with the wafer W whose warp is corrected and held in a flat state by the holding table, and suction-holds the wafer W.

The chuck table 15 is configured to move downward to a position the wafer W comes close to the adhesive tape DT in the center of the ring frame f while being fitted in an opening of the ring frame lifting mechanism 26 for attraction-holding the ring frame f, to which the adhesive tape DT to be described later is joined from the back side.

At this time, the chuck table 15 and the ring frame elevating mechanism 26 are held by a holding mechanism (not shown).

The ring frame supply part 16 has a wagon shape having a bottom provided with wheels, and is loaded inside the apparatus. The upper part of the ring frame supply part 16 is opened so that the ring frames f interiorly housed in multiple stages can be slid up and fed out.

The ring frame transport mechanism 17 sequentially sucks by vacuum the ring frames f housed in the ring frame supply part 16 from the top one by one, and transports the ring frame f in the order of the alignment stage (not shown) and a position where the adhesive tape DT is joined. The ring frame transport mechanism 17 also serves as a holding mechanism which holds the ring frame f in the position of joining the adhesive tape DT at the time of joining the adhesive tape DT.

The tape processing part 18 includes a tape supply part 19 for supplying the adhesive tape DT, a tension mechanism 20 for tensioning the adhesive tape DT, a joining unit 21 for joining the adhesive tape DT to the ring frame f, a cutter mechanism 24 for cutting the adhesive tape DT joined to the ring frame f, a separation unit 23 for separating an unnecessary tape from the ring frame f after the cutting by the cutter mechanism 24, and a tape collecting part 25 for collecting the cut unnecessary remaining tape.

The tension mechanism 20 catches both ends of the adhesive tape DT in the width direction and applies tension in the tape width direction. Specifically, when the soft adhesive tape DT is used, vertical wrinkles generate in the surface of the adhesive tape DT along the tape supply direction due to tension applied in the tape supply direction. In order to uniformly join the adhesive tape DT to the ring frame f while avoiding the vertical wrinkles, tension is applied from the tape width direction side.

The joining unit 21 is disposed in the standby position obliquely below (lower left in FIG. 1) the ring frame f held above the adhesive tape DT. A joining roller 22 provided in the joining unit 21 moves to the joining start position on the right side in the tape supply direction when the ring frame f held by the ring frame transport mechanism 17 is transported to the position where the adhesive tape DT is joined and supply of the adhesive tape DT from the tape supply part 19 starts.

The joining roller 22 arrived at the joining start position moves upward and presses and joins the adhesive tape DT to the ring frame f, and then rolls from the joining start position toward the standby position to join the adhesive tape DT to the ring frame f while pressing the adhesive tape DT.

The separation unit 23 separates an unnecessary portion of the adhesive tape DT cut by the cutter mechanism 24 which will be described later from the ring frame f. Concretely, after the adhesive tape DT is joined to the ring frame f and is cut, the holding of the adhesive tape DT by the tension mechanism 20 is released. The separation unit 23 moves toward the tape supply part 19 over the ring frame f to separate the cut unnecessary adhesive tape DT.

The cutter mechanism 24 is disposed below the adhesive tape DT on which the ring frame f is mounted. After the adhesive tape DT is joined to the ring frame f by the joining unit 21, the holding of the adhesive tape DT by the tension mechanism 20 is released. The cutter mechanism 24 thereafter moves upward. The cutter mechanism 24 moved upward cuts the adhesive tape DT along the ring frame 1.

The ring frame lifting mechanism 26 is in a standby position above the position where the adhesive tape DT is joined to the ring frame f. The ring frame lifting mechanism 26 moves downward when the process of joining the adhesive tape DT to the ring frame f is finished, and suction-holds the ring frame f. At this time, the ring frame transport mechanism 17 that has held the ring frame f returns to the initial position above the ring frame supply part 16.

The ring frame lifting mechanism 26 suction-holds the ring frame f and moves upward to the position where the wafer W is joined to the ring frame f. At this time, the chuck table 15 that suction-holds the wafer W moves downward to the position where the wafer W is joined to the ring frame f.

The mount frame fabrication part 27 includes a joining roller 28 whose circumferential surface is elastically deformable. The joining roller 28 rolls while pressing a non-adhesion surface of the adhesive tape DT joined to the back side of the ring frame f.

The first mount frame transport mechanism 29 sucks by vacuum the mount frame MF integrally formed with the ring frame f and the wafer W, and transfers the mount frame MF to a separation table (not shown) of the separation mechanism 30.

Figure 2:
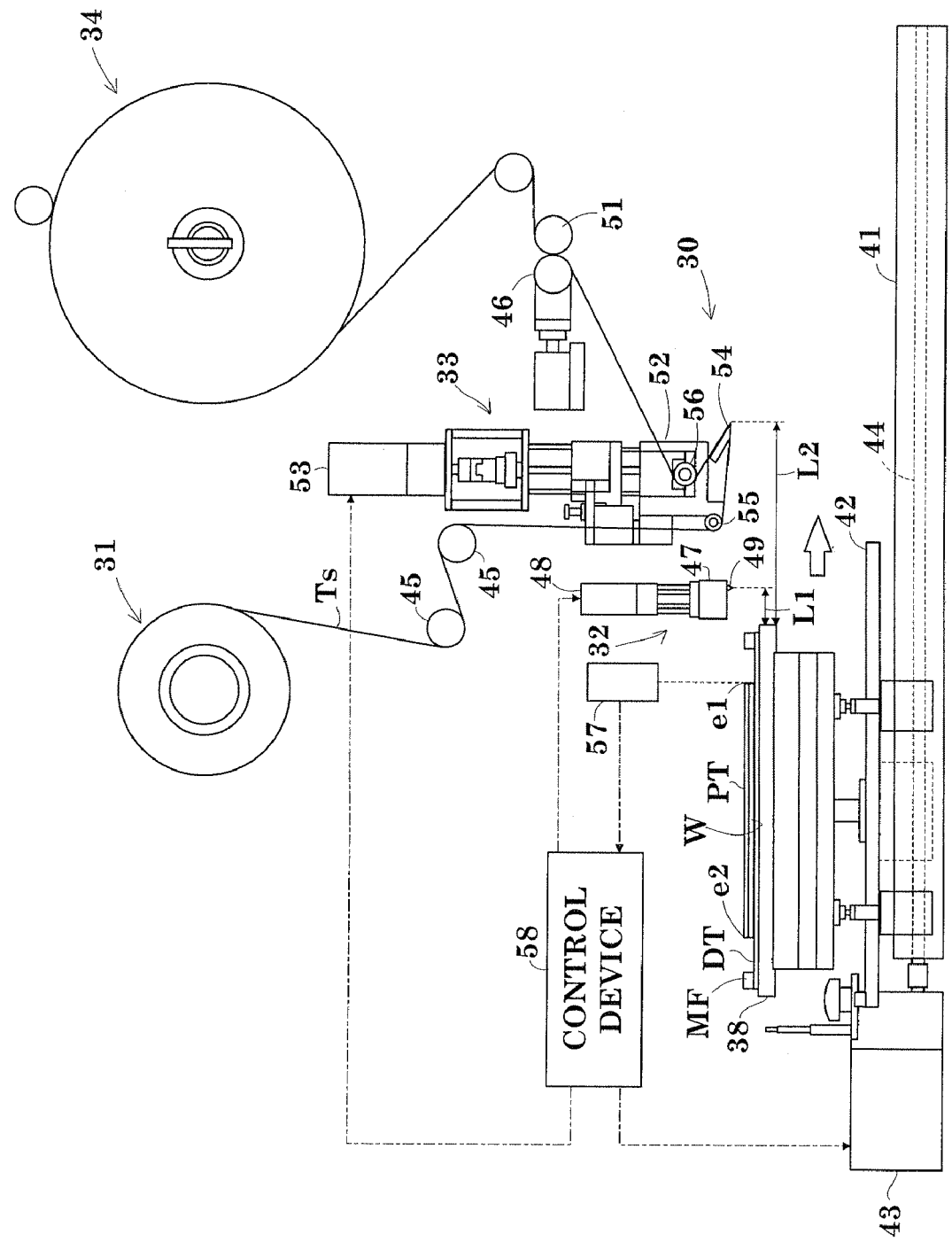
FIG. 2 is a side view illustrating a separation mechanism according to a first embodiment.

As shown in FIG. 2, the separation mechanism 30 includes a separation table 38 on which the wafer W is mounted and which moves the wafer W, a tape supply part 31 for supplying the separation tape Ts, a first separation unit 32 for separating one part of the peripheral edge of the protective tape PT, a second separation unit 33 for joining and separating the separation tape Ts, and a tape collecting part 34 for collecting the separated separation tape Ts and the protective tape PT. The elements except for the separation table 38 in the separation mechanism 30 are provided in a position fixed state in the apparatus.

The tape supply part 31 corresponds to separation tape supplying means. The separation tape may be thermosetting adhesive tape having heat curable property, pressure sensitive adhesive tape cured by heat or ultraviolet light, thermoplastic adhesive tape, and the like. In addition, a sticky tape can be applied in place of such an adhesive tape.

The separation table 38 is configured to suck the mount frame MF from the back side by vacuum and is supported by a movable stand 42, which is supported so as to be slidable forward/backward along a pair of left and right rails arranged horizontally in the front and back direction. The movable stand 42 is screw fed and driven by a screw shaft 44 forward-reversely driven with a pulse motor 43. The rail 41, the movable stand 42, the pulse motor 43, the screw shaft 44, and the like configure horizontal driving means of the present invention.

The tape supply part 31 is configured to guide and supply the separation tape Ts led from the separation tape roller to the lower end of the first and the second separation units 32, 33 through a guide roller 45.

The tape collecting part 34 is configured to lead the separation tape Ts fed from the lower end of the separation units 32, 33 upward through a motor driven feeding roller 46 and a guide roller 51, and wind and collect the separation tape Ts.

The first separation unit 32 is arranged with a movable block 47 which can be vertically lifted, a pulse motor 18 which screw feeds and vertically lifts the movable block 47, and a needle 49 having a sharp tip serving as a separation member of the separation tape Ts at the lower end of the movable block 47. The length of the needle 49 projecting out from the lower end of the movable block 47 is set shorter than the thickness of the protective tape PT. That is, the length is set such that the tip of the needle 49 does not reach the surface of the wafer W when the bottom surface of the movable block 47 contacts the surface of the protective tape PT. The movable block 47, the pulse motor 48, and the like constitute first lifting driving means of the present invention.

The second separation unit 33 is arranged with a movable block 52 which can be vertically lifted, a pulse motor 53 which vertically moves the movable block 52, an edge member 54 having a sharp distal end serving as the joining member and the separation member of the separation tape Ts at the lower end of the movable block 52, a receiving guide roller 55 for guiding the supplied separation tape Ts to the distal end of the edge member 54, and a feeding guide roller 56 for guiding the separation tape Ts turned back at the distal end of the edge member 54 towards the tape collecting part 34. The edge member 54 is configured by a plate member having a wider width than that of the diameter of the wafer, and is attached and fixed in an inclined orientation with the front side facing downward. The movable block 52, the pulse motor 53, and the like constitute second lifting driving means of the present invention.

The first separation unit 32 includes a detection device 57 for detecting, in a non-contacting manner, the height to the object opposing on the lower side at a position spaced apart by a predetermined distance L1 from the tip of the needle 49 in the separation tape joining direction. The detection device 57 includes a specification of projecting a laser light of a predetermined wavelength perpendicularly downward, receiving the reflected light thereof, and detecting the distance (height) to the light projected object, ultrasonic wave sensor, and the like. Detected information from the height detection device 57 is transferred to a control device 58 for controlling the operations of the pulse motor 43 that movably drives the separation table 38 forward and backward, and the pulse motors 48, 53 that vertically lift the needle 49 and the edge member 54. The wavelength and the output of the projected laser beam differ depending on the type, the thickness, and the like of the used protective tape PT. For example, a single wavelength of 0.6 to 1 µm etc. is used in the present embodiment. The control device 58 corresponds to controlling means of the present invention.

The operation amount of the pulse motor 43 for movably driving the separation table 38 forward and backward is measured with a rotary encoder and the like. In other words, the horizontal movement position of the separation table 38 is detected. The detected information is also transferred to the control device 58.

The second mount frame transport mechanism 35 sucks by vacuum the mount frame MF pushed from the separation mechanism 30, and moves to mount the mount frame MF onto the turn table 36.

The turn table 36 positions the mount frame MF and houses the mount frame MF into the mount frame collecting part 37. To be specific, when the mount frame MF is mounted on the turn table 36 by the second mount frame transport mechanism 35, the mount frame MF is positioned on the basis of the orientation flat of the wafer W, the positioning shape of the ring frame f, and the like. The turn table 36 is rotated to change the direction of housing the mount frame MF into the mount frame collecting part 37. When the housing direction is determined, the turn table 36 pushes the mount frame MF by a pusher (not shown) to house the mount frame MF into the mount frame collecting part 37.

The mount frame collecting part 37 is mounted on a lifting mount table (not shown). By the vertical movement of the mount table, the mount frame MF pushed by the pusher can be housed in an any stage in the mount frame collecting part 37.

A series of operations of the semiconductor wafer mount apparatus of the above embodiment will now be described with reference to FIGS. 1 to 13.

The wafer holder of the robot arm 4 is inserted in the gap between the cassettes C. The wafer W is suction-held from below and pushed one by one. The pushed wafer W is transported to the alignment stage 7.

The wafer W is mounted on the holding table by the robot arm 4 and suction-held from the back side. At this time, the suction level of the wafer W is detected by a manometer (not shown), and is compared with a reference value predetermined with respect to a pressure value in normal operation.

When abnormality of suction is detected, the pressing plate 6 presses against the surface of the wafer W, and the wafer W is suction-held in a flat state obtained by correcting the warp. The wafer W is positioned on the basis of an orientation flat or a notch.

After completion of positioning on the alignment stage 7, the surface of the wafer W is irradiated with ultraviolet rays by the ultraviolet irradiation unit 14.

The wafer W subjected to the ultraviolet irradiating process is transported to the next mount frame fabrication part 27 while being suction-held by the holding table on the alignment stage 7. The alignment stage 7 moves to an intermediate position between the chuck table 15 and the ring frame lifting mechanism 26.

When the alignment stage 7 waits in a predetermined position, the chuck table 15 positioned above moves downward, the bottom face of the chuck table 15 comes into contact with the wafer W, and the chuck table 15 starts sucking the wafer W by vacuum. When the vacuum-suction of the chuck table 15 starts, the suction-holding on the holding table side is released, and the wafer W is received by the chuck table 15 in a flat state where the warp is corrected. The alignment stage 7 that has delivered the wafer W returns to the initial position.

The ring frames f housed in multiple stages in the ring frame supply part 16 are sucked by vacuum and ejected one by one from the top by the ring frame transport mechanism 17. The ejected ring frame f is positioned on an alignment stage (not shown) and, after that, is transported to the adhesive tape DT joining position above the adhesive tape DT.

When the ring frame f is held by the ring frame transport mechanism 17 and is in the adhesive tape DT joining position, supply of the adhesive tape DT from the tape supply part 19 starts. Simultaneously, the joining roller 22 moves to the joining start position.

When the joining roller 22 arrives at the joining start position, the tension mechanism 20 holds both ends in the width direction of the adhesive tape DT and applies tension in the tape width direction.

Next, the joining roller 22 moves upward to press the adhesive tape DT against the end of the ring frame f and join it. After joining the adhesive tape DT to the end of the ring frame f, the joining roller 22 rolls toward the tape supply part 19 side as the standby position. At this time, the joining roller 22 rolls while pushing the adhesive tape DT from the non-adhesion surface to thereby join the adhesive tape DT to the ring frame f. When the joining roller 22 reaches the terminating end of the joining position, holding of the adhesive tape DT by the tension mechanism 20 is released.

Simultaneously, the cutter mechanism 24 moves upward to cut the adhesive tape DT along the ring frame f. After completion of cutting of the adhesive tape DT, the separation unit 23 moves toward the tape supply part 19 side and separates the unnecessary adhesive tape DT.

After that, the tape supply part 19 operates to feed the adhesive tape DT and the unnecessary portion of the cut tape is sent to the tape collecting part 25. At this time, the joining roller 22 moves to the joining start position so as to join the adhesive tape DT to the next ring frame f.

The frame portion of the ring frame f to which the adhesive tape DT is joined is suction-held by the ring frame lifting mechanism 26 and is moved upward. At this time, the chuck table 15 also moves downward. That is, the chuck table 15 and the ring frame lifting mechanism 26 move to the position where the wafer W is joined.

The mechanisms 15 and 26 each arrive at predetermined positions and are held by holding mechanisms (not shown). Next, the joining roller 28 moves to the joining start position of the adhesive tape DT, and rolls while pressing the non-adhesion surface of the adhesive tape DT joined to the bottom face of the ring frame f, thereby joining the adhesive tape DT to the wafer W. As a result, the mount frame MF obtained by integrating the ring frame f and the wafer W is fabricated.

Figure 14:
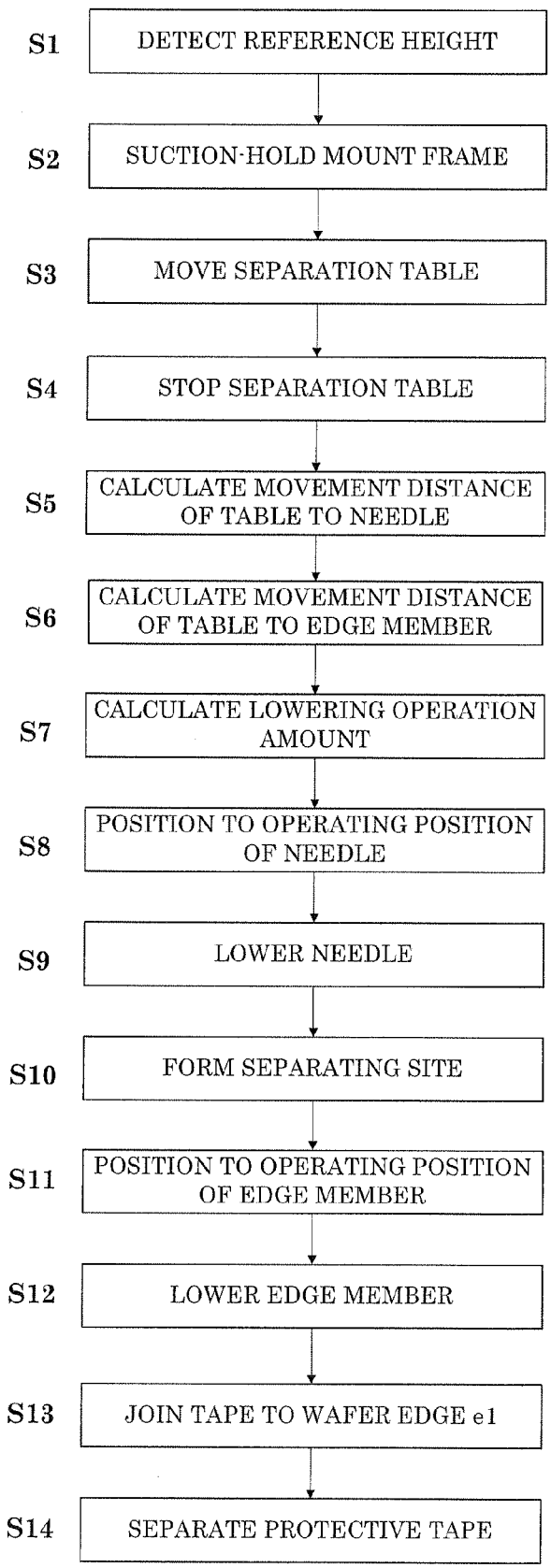
FIG. 14 is a flowchart showing the operation of the separation mechanism.

After the mount frame MF is fabricated, the chuck table 15 and the ring frame lifting mechanism 26 move upward. At this time, a holding table (not shown) moves to a position below the mount frame MF, and the mount frame MF is mounted on the holding table. The mounted mount frame MF is suction held by the first mount frame transport mechanism 29 and moves to mount onto the separation table 38, and is then subjected to a protective tape separation process according to the procedures shown in the flowchart of FIG. 14.

Prior to mounting the mount frame MF on the separation table 38, the detection device 57 is operated and the height from the separation table 38 to the detection device 57 is detected. The detection result is retrieved into the control device 58 as a reference height (step S1).

The mount frame MF is moved and mounted on the separation table 38, and then suction-held (step S2). As shown in FIG. 2, the separation table 38 with the mount frame MF mounted thereon is moved forward to the lower side of the first separation unit 32 (step S3). In this process, the surface height of the protective tape PT and the adhesion surface of the adhesive tape DT exposed between the ring frame f and the wafer W are distinguished from the changes in light intensity of the reflected light when the laser beam projected vertically downward from the detection device 57 is reflected and returned, or the return time until the projected beam is reflected and then the reflected beam is received, and thereby the front end edge of the protective tape PT is detected.

That is, the height of a part where the detection value by the detection device 57 suddenly changes and the position of the separation table 38 at the relevant count time are stored in the control device 58 as positions of wafer edges e1, e2 at both ends (step S4).

The control device 58 first calculates the operating position for forming the separating site on the protective tape PT with the needle 49. In a case of the present embodiment, the horizontal distance from the tip of the needle 49 to the wafer edge e1 is calculated. In view of this calculation result and the thickness of the needle 49, the operating position where the side surface of the needle approaches to the wafer edge e1 and the horizontal movement distance thereof are calculated (step S5).

The distance L1 from the tip of the needle 49 to the end on the joining start position side of the separation tape Ts of the separation table 38 is known in advance at the time of setting the apparatus. Therefore, the operating position and the horizontal movement distance can be determined by calculating the actual measurement distance from the end of the separation table 38 to the wafer edge e1 by the detection device 57 and adding this actual measurement distance to the distance L1.

Similarly, the operating position and the horizontal movement distance of the edge member 54 are calculated (step S6). That is, a distance L2 from the distal end of the edge member 54 to the end on the joining start side of the separation tape Ts of the separation table 38 is known in advance at the time of setting the apparatus. Therefore, the operating position and the horizontal movement distance can be determined by calculating the actual measurement distance from the end of the separation table 38 to the wafer edge e1 by the detection device 57 and adding this actual measurement distance to the distance L2.

The control device 58 calculates the lowering operation amount of the needle 49 and the edge member 54 (step S7). For instance, a plurality of height detection values in a predetermined range (e.g., 1 to 20 mm) from the wafer edge e1 that becomes the separation tape joining start side are averaged through calculation with the control device 58, and the resultant average is determined as the surface height of the protective tape PT. The lowering operation amounts of the needle 49 and the edge member 54 are determined based on this value. The operation amount of the edge member 54 is obtained using the height of the edge member 54 at the origin position set in advance by subtracting the thickness of the separation tape Ts wound around the edge member 54 from the surface height of the protective tape PT acquired by averaging. With respect to the needle 49, the projecting length is set in advance to a value it does not pass through the adhesion layer according to the thickness of the protective tape PT to be used. Therefore, the tip does not pass through the protective tape PT by setting the distance from the tip to the surface of the protective tape PT as the operation amount.

The lowering operation amount of contacting the separation tape Ts to the surface of the protective tape PT with a predetermined pressing force by lowering the needle 49 and the edge member 54 is determined in the above manner. The control device 58 has a function serving as calculation means of the present invention.

Figure 3:
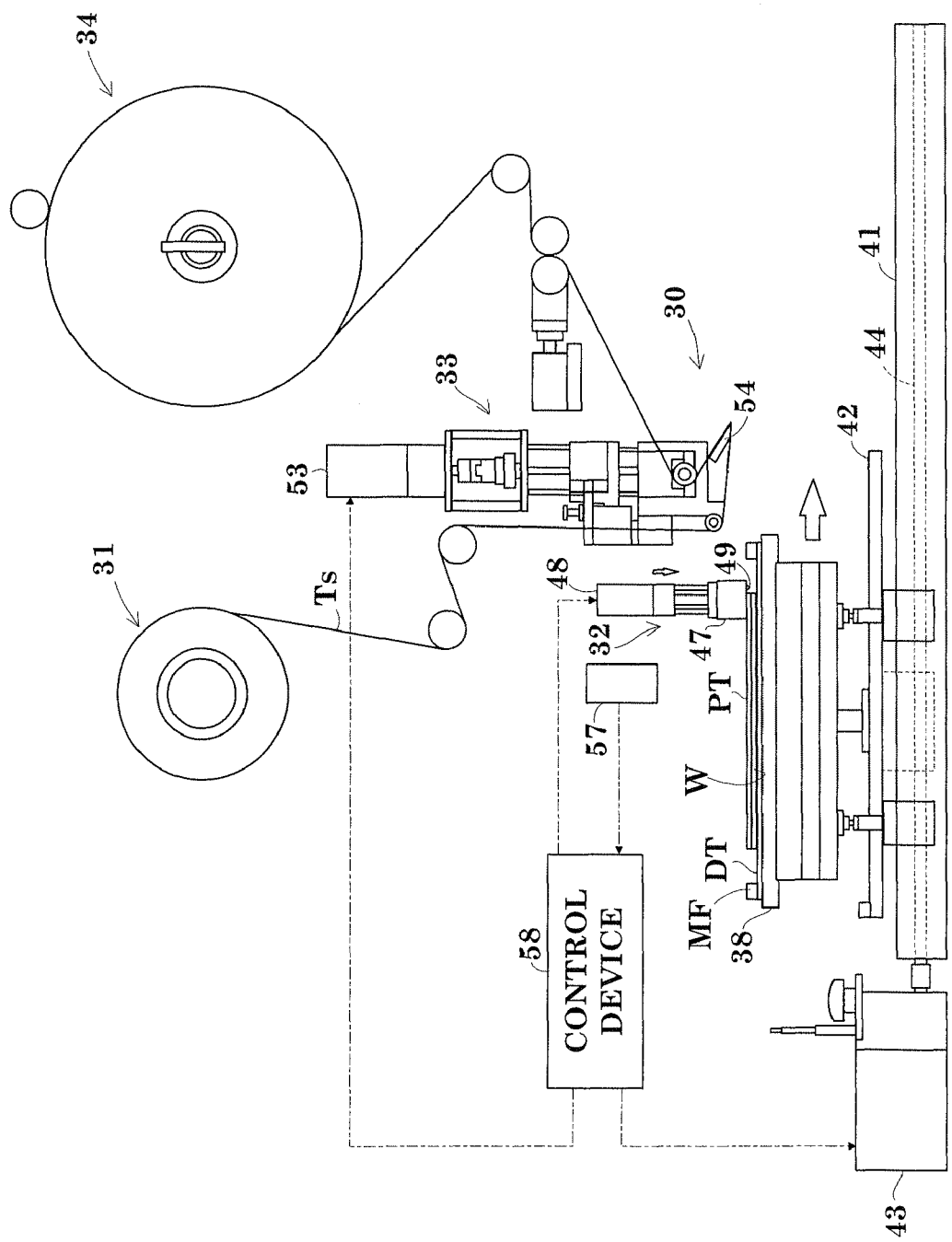
FIG. 3 is a side view illustrating operation steps of the separation mechanism of the first embodiment.
Figure 4:
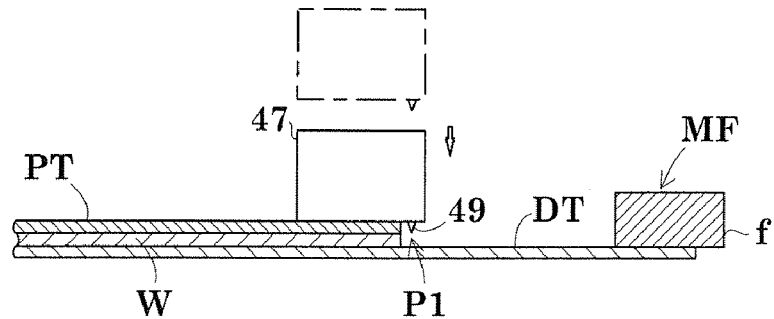
FIGS. 4 to 6 are side views, illustrating operation steps of the separation mechanism.
Figure 8:
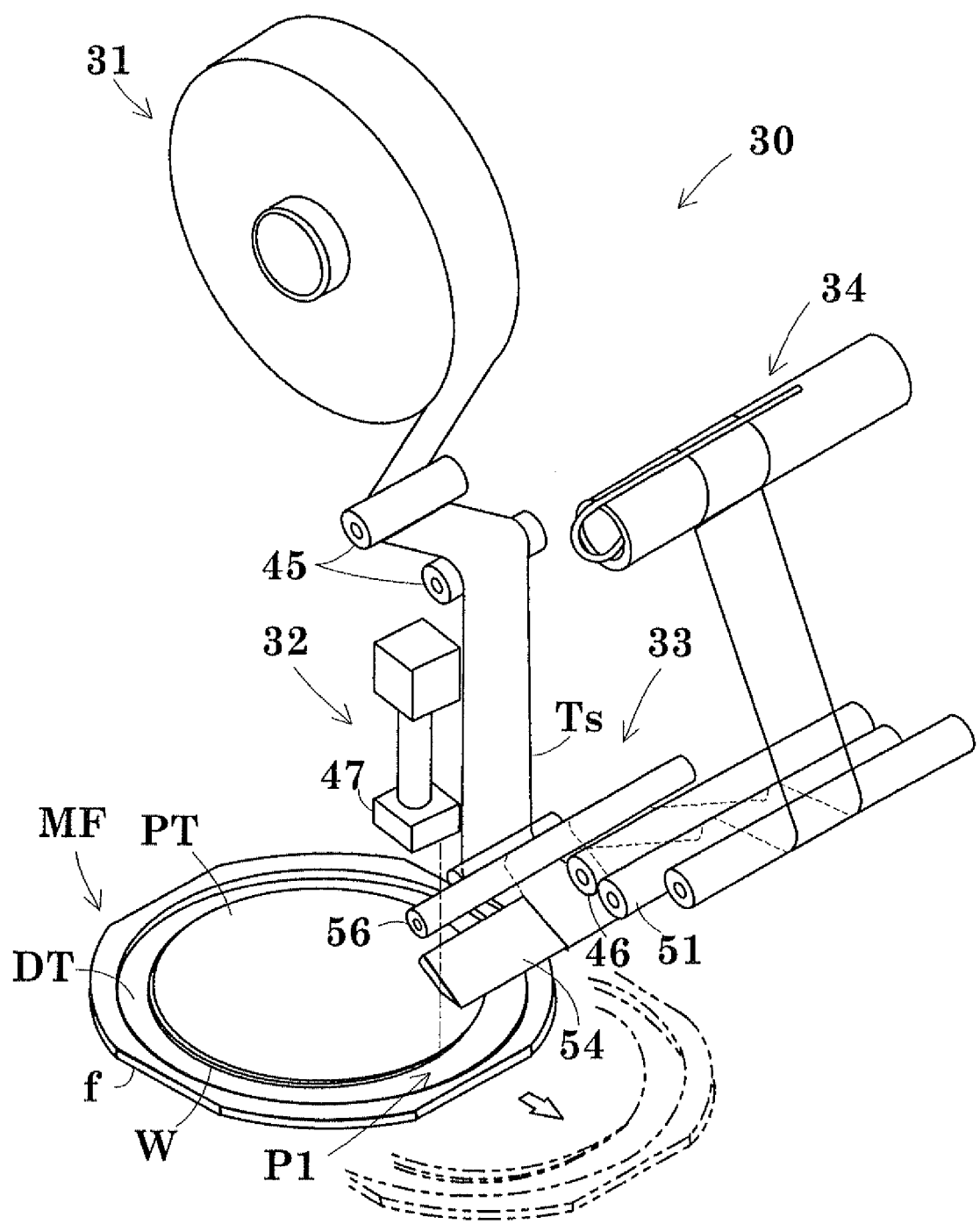
FIG. 8 is a perspective view showing an operation process of the separation mechanism.

The control device 58 controls the pulse motor 43 so that the separation table 38 moves forwardly based on the calculated horizontal movement distance of the needle 49, and once stops the forward movement of the separation table 38 at the time the separation table arrives at the operating position P1 as shown in FIG. 8 (step S8). As shown in FIGS. 3 and 4, the pulse motor 48 is next operated and the movable block 47 is lowered to a predetermined height based on the lowering operation amount of the needle 49 (step S9).

The control device 58 stops the operation of the pulse motor 48 when the movable block 47 reaches the predetermined height. That is, the pulse motor 48 stops at a height where one part (left side in the drawing) of the bottom surface of the movable block 47 contacts the surface of the protective tape PT, and the tip of the needle 49 does not exceed the thickness of the protective tape PT.

Figure 5:
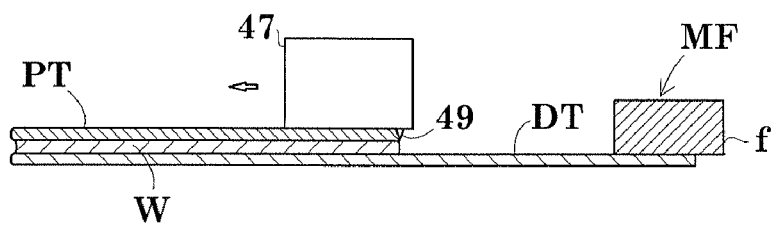
Figure 6:
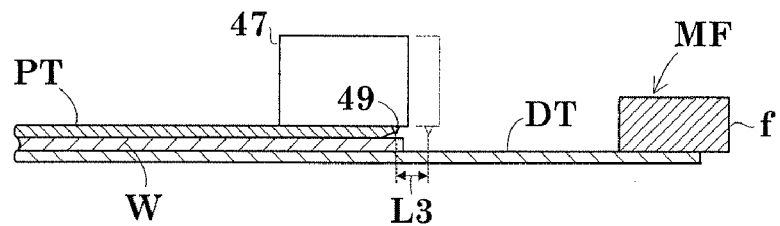

As shown in FIG. 5 and FIG. 6, the control device 58 again controls the pulse motor 43 to move the separation table 38 forward by a predetermined distance L3. At this point, the tip of the needle 49 is hooked at the peripheral edge of the protective tape PT, and one part of the peripheral edge of the protective tape PT starts to separate (step S10). The distance L3 is appropriately set according to the type of protective tape PT to be used such as the distance where the average value of the surface height of the protective tape PT is obtained.

Figure 7:
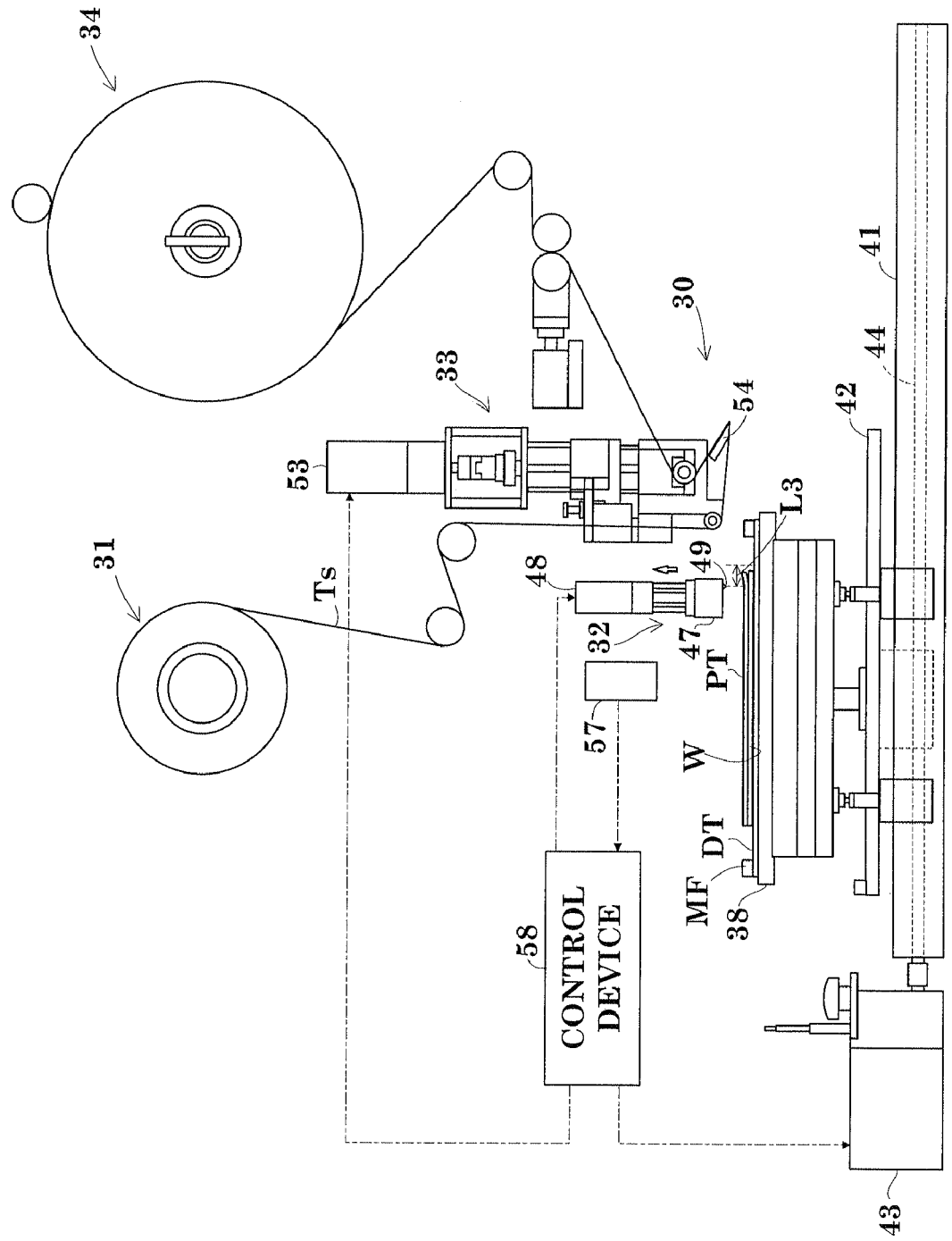
FIG. 7 is an enlarged side view of the main parts showing a separation operation of the first separation unit.

When the separation table 38 arrives at the terminating position of the distance L3, the control device 58 once stops the operation of the pulse motor 13 and operates the pulse motor 48, and moves upward the movable block 47 to the standby position, as shown in FIG. 7. That is, the first separation unit 32 returns to the standby position.

Figure 9:
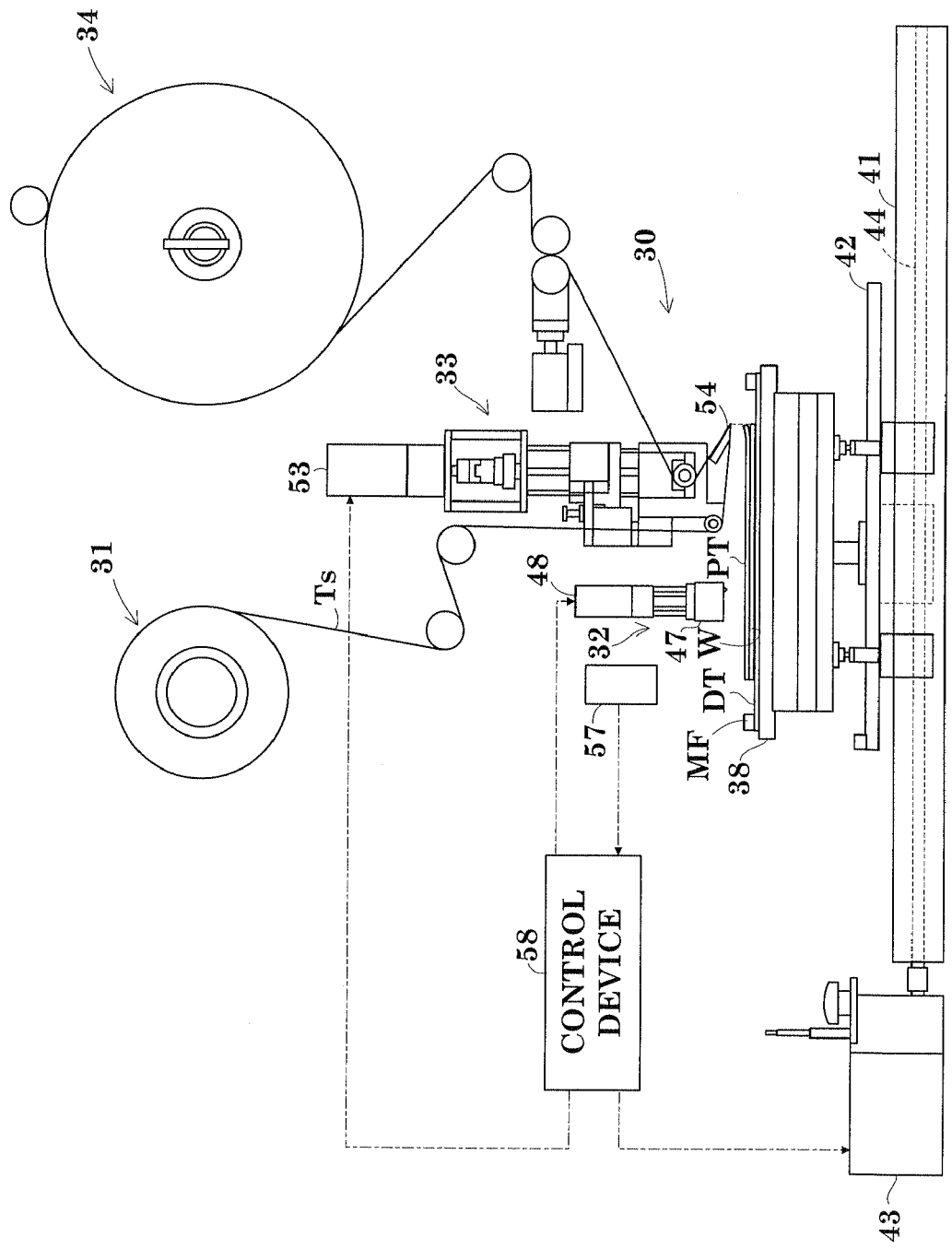
FIGS. 9 to 11 are side views showing the operation process of the separation mechanism of the first embodiment.

When the movable block 47 arrives at the moving backward position, the control device 58 stops the pulse motor 48. Thereafter, the control device 58 operates the pulse motor 43, and moves the separation table 38 forward based on the calculated horizontal movement distance of the edge member 54, as shown in FIG. 9. That is, the forward movement is automatically once stopped when the front end edge of the protective tape PT arrives at a position immediately below the distal end of the edge member 54 (step S11).

Figure 10:
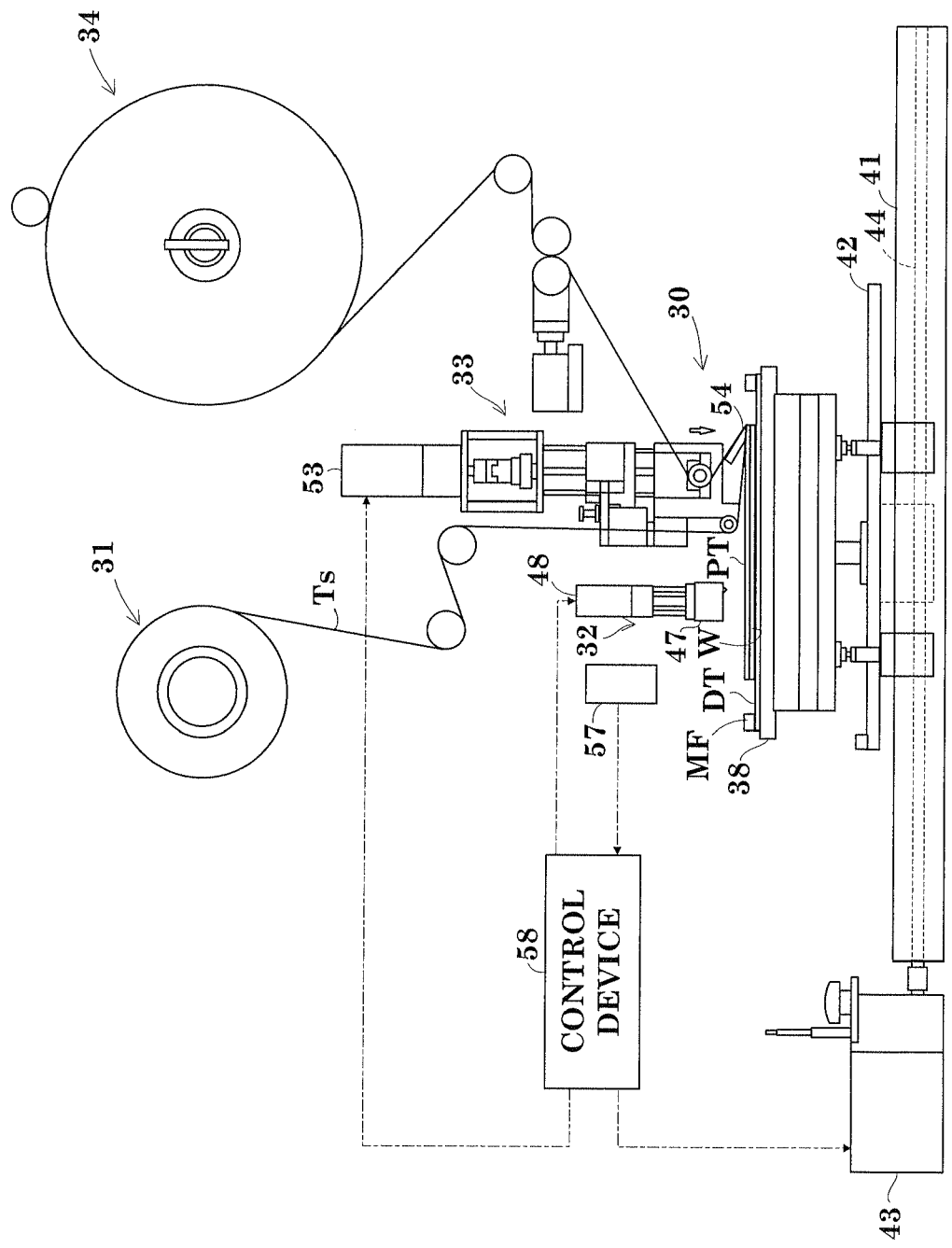
Figure 12:
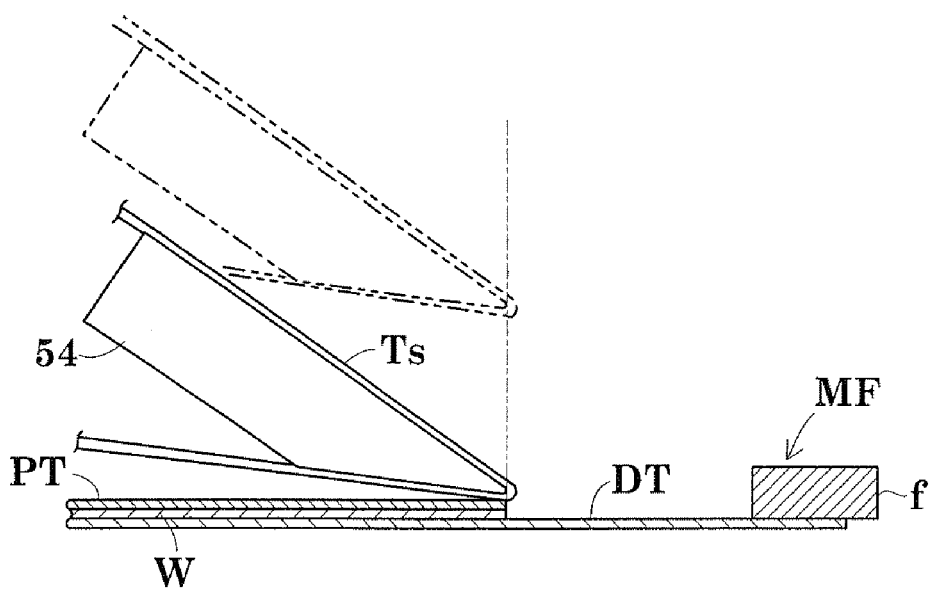
FIGS. 12 and 13 are enlarged side views of the main parts showing the joining operation and the separation operation of the second separation unit.

After the separation table 38 is once stopped, the pulse motor 53 is controlled to lower the movable block 52 based on the calculated lowering operation amount of the edge member 54, as shown in FIG. 10 (step S12). The edge member 54 is then lowered while being wound by the separation tape Ts supplied from the tape supply part 31, and the separation tape Ts is pressed with the predetermined pressing force to be joined with the distal end of the edge member 54 at the position of the protective tape PT separated in advance by the needle 49, as shown in FIG. 12 (step S13).

Figure 11:
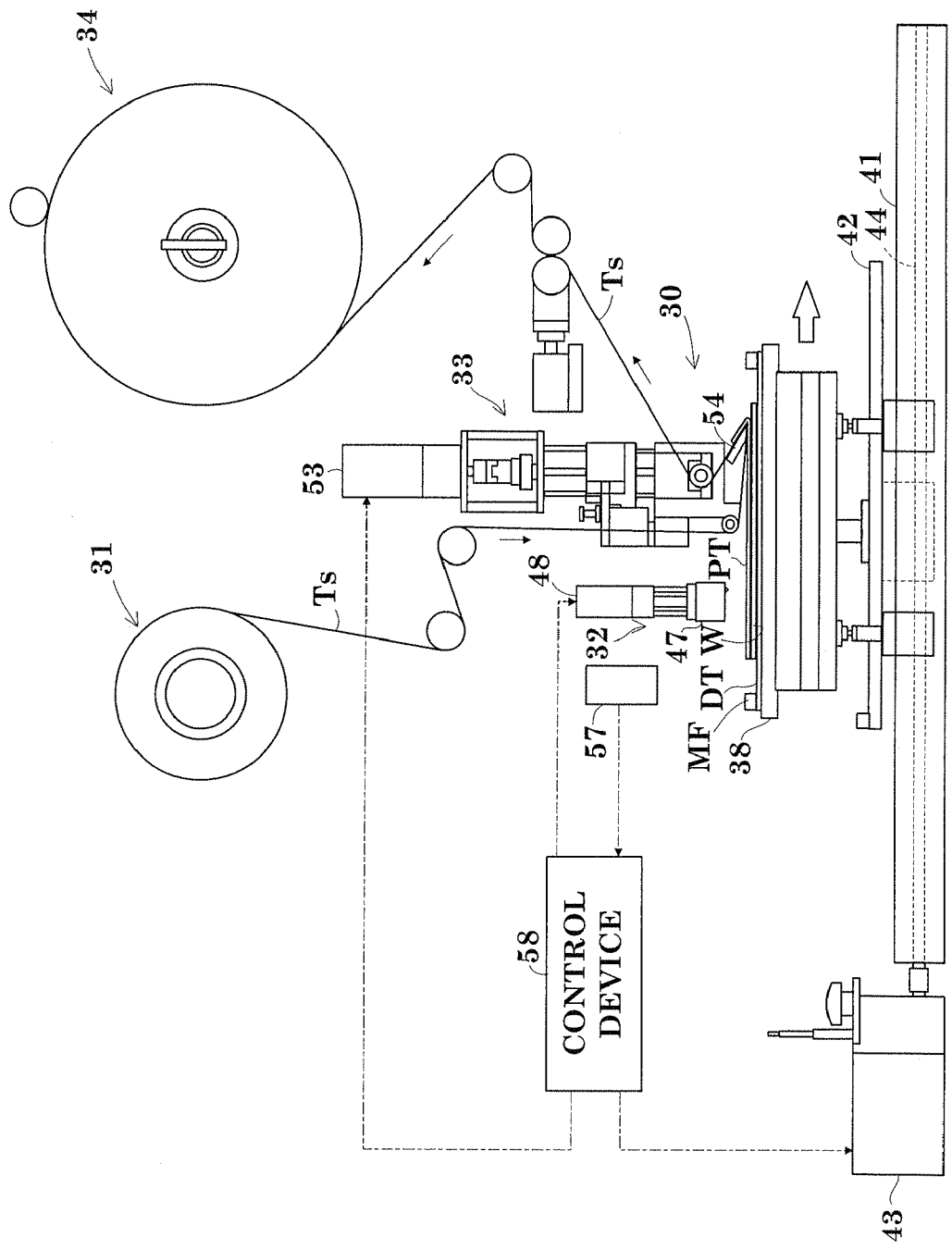
Figure 13:
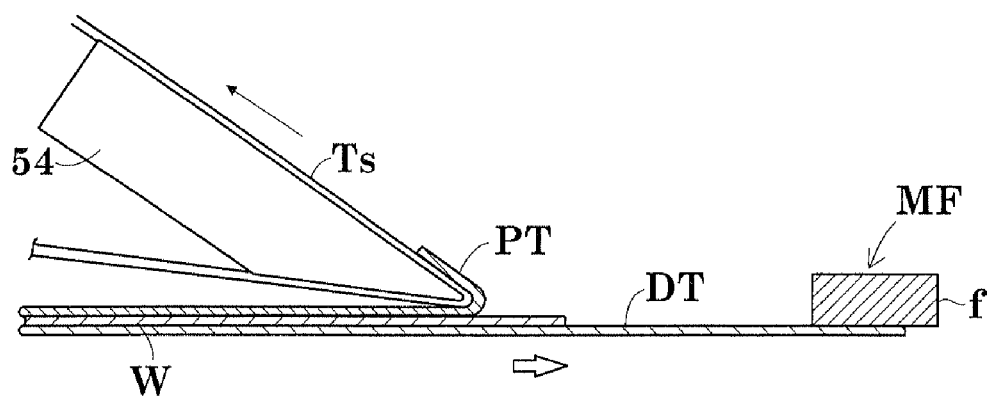

After the joining of the separation tape Ts to the front end of the protective tape PT is completed, the separation table 38 starts again to move forward with the separation tape Ts pressed against the protective tape PT with the edge member 54, as shown in FIGS. 11 and 13. At the same time, the separation tape Ts is wound towards the tape collecting part 34 at a speed tuned with the movement speed. With this operation, the edge member 54 joins the separation tape Ts to the wafer edge e2 while pressing the separation tape Ts against the protective tape PT on the surface of the wafer W, and at the same time, separates the protective tape PT from the surface of the wafer W integrally with the separation tape Ts while separating the joined separation tape Ts (step S14).

At the time when the pulse motor 43 is controlled so that the edge member 54 moves forward by a distance corresponding to the diameter of the wafer from the lowering operated separation tape joining start position, that is, at the time when the edge member 54 arrives at the back end edge of the protective tape PT and the protective tape PT is completely separated from the surface of the wafer, the edge member 54 is controlled for moving upward, and the second separation unit 33 returns to the initial state.

The mount frame MF subjected to the process of separating the protective tape PT is moved to the standby position of the second mount frame transport mechanism 35 by the separation table 38.

The mount frame MF ejected from the separation mechanism 30 moves to mount onto the turn table 36 by the second mount frame transport mechanism 35. The transferred mount frame MF is positioned on the basis of the orientation flat or notch, and its housing direction is adjusted. After completion of the positioning and adjustment of the housing direction, the mount frame MF is pushed by the pusher and housed into the mount frame collecting part 37.

As described above, the excessive load by the pressing force of the needle 49 in time of separating the protective tape is not applied on the wafer W by detecting the surface height of the protective tape PT to calculate the lowering operation amount of the needle 49, and controlling the height of the needle 49 at the operating position based on the calculation result. Therefore, the wafer W will not be damaged. After separating one part of the peripheral edge of the protective tape PT with the tip of the needle 49 and forming a separating site, the separation tape Ts is joined to the surface of the protective tape PT from the separating site and the separation tape Ts is separated from the separating site as the starting point, so that the protective tape PT can be reliably separated from the end integrally with the separation tape Ts.

The excessive load by the pressing force of the edge member 54 in time of separating the protective tape is not applied on the wafer W by detecting the surface height of the protective tape PT to calculate the lowering operation amount of the edge member 54, and controlling the height of the edge member 54 at the operating position based on the calculation result. Therefore, the separation tape Ts can be joined to the surface of the protective tape PT so as to be adhered thereto without damaging the wafer W, and the protective tape PT can be accurately separated from the wafer W integrally with the separation tape Ts from the separating site of the protective tape PT.

A second embodiment of the present invention will now be described. This embodiment is the same as the first embodiment other than that the configuration of the needle 49 is changed, and thus the same reference numerals are denoted for the same configuring portions, and the differing configuring portion will be specifically described.

Figure 15:
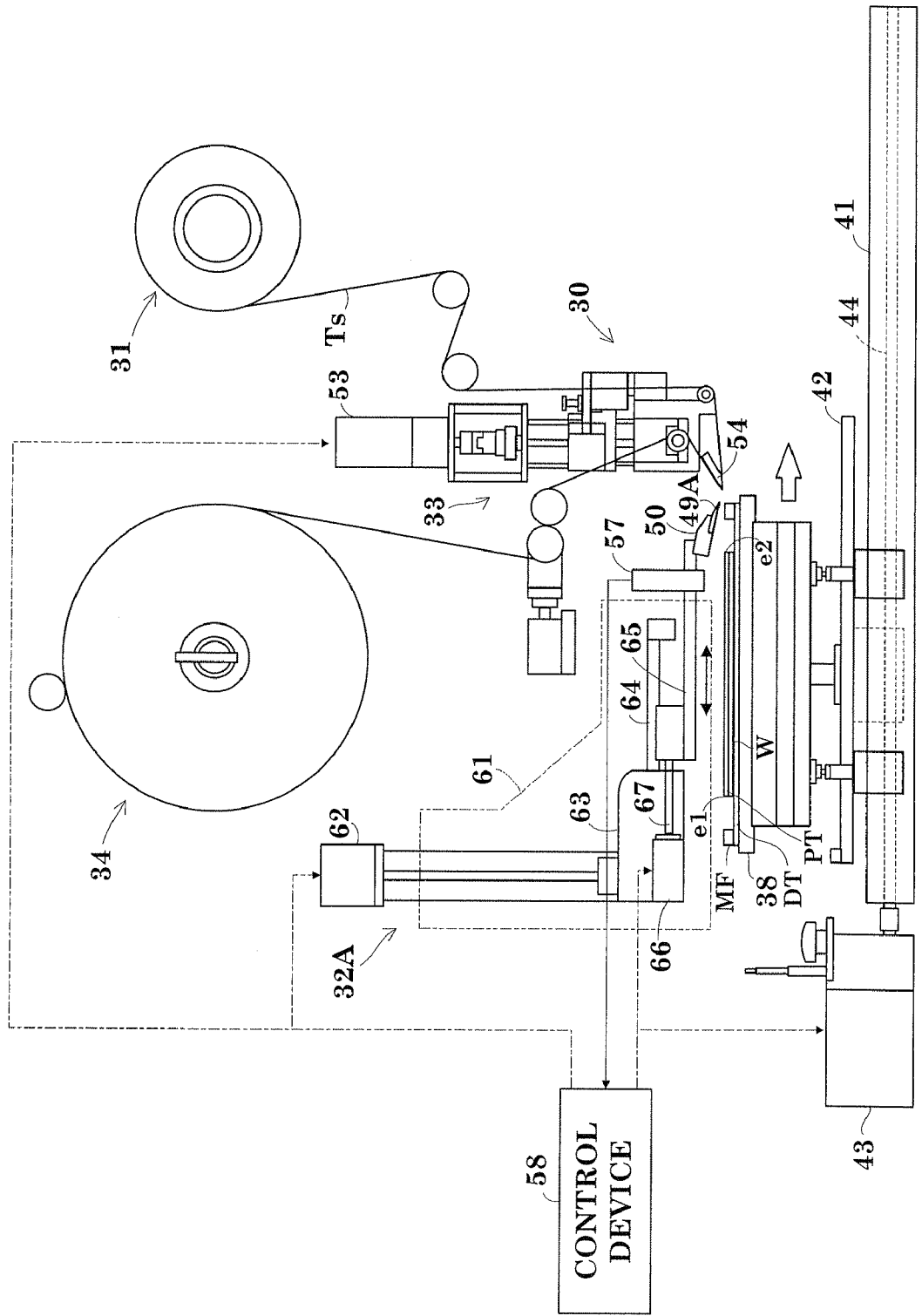
FIG. 15 is a side view of a separation mechanism according to a second embodiment.
Figure 16:
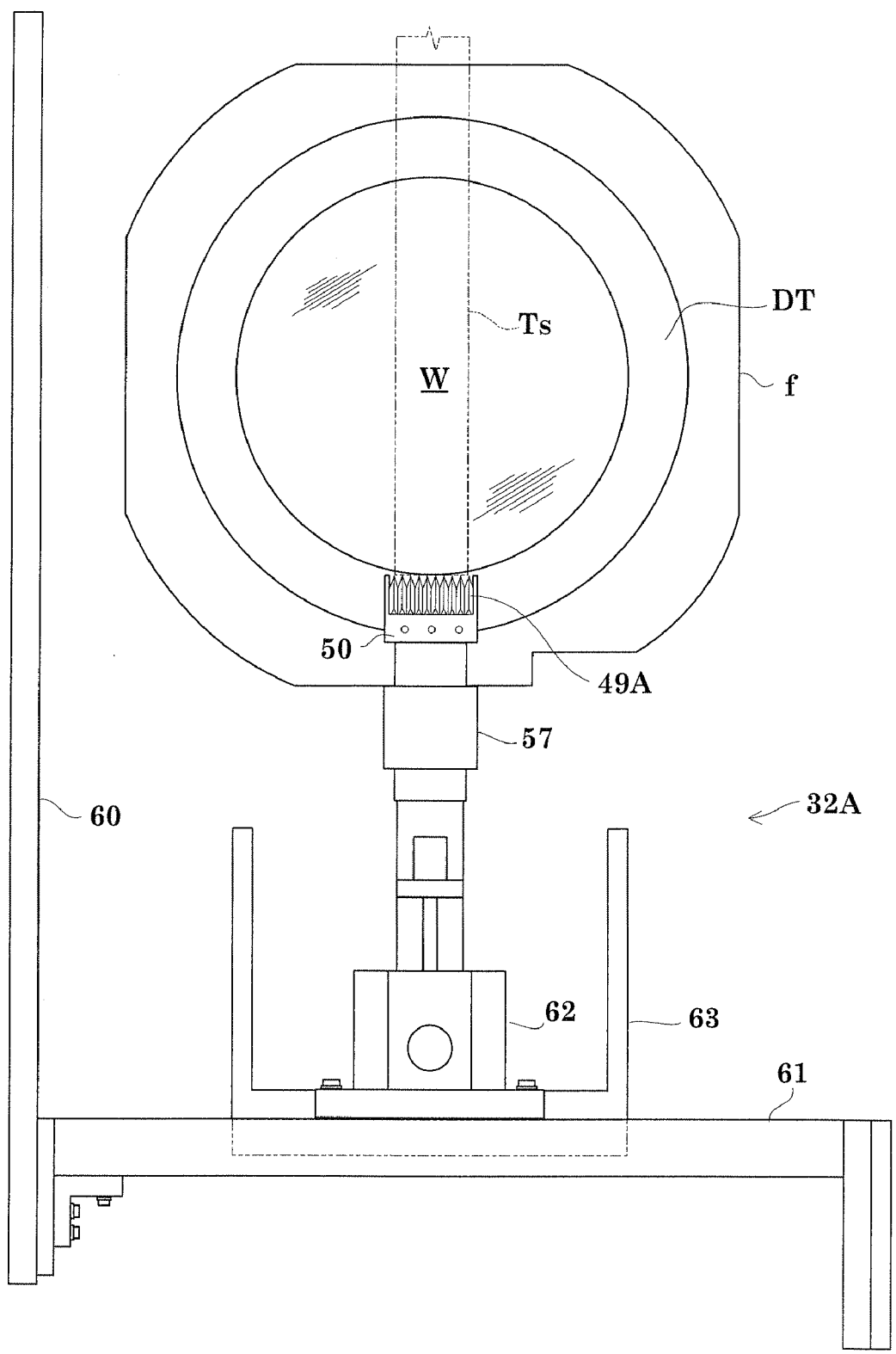
FIG. 16 is a plan view of the separation mechanism according to the second embodiment.
Figure 17:
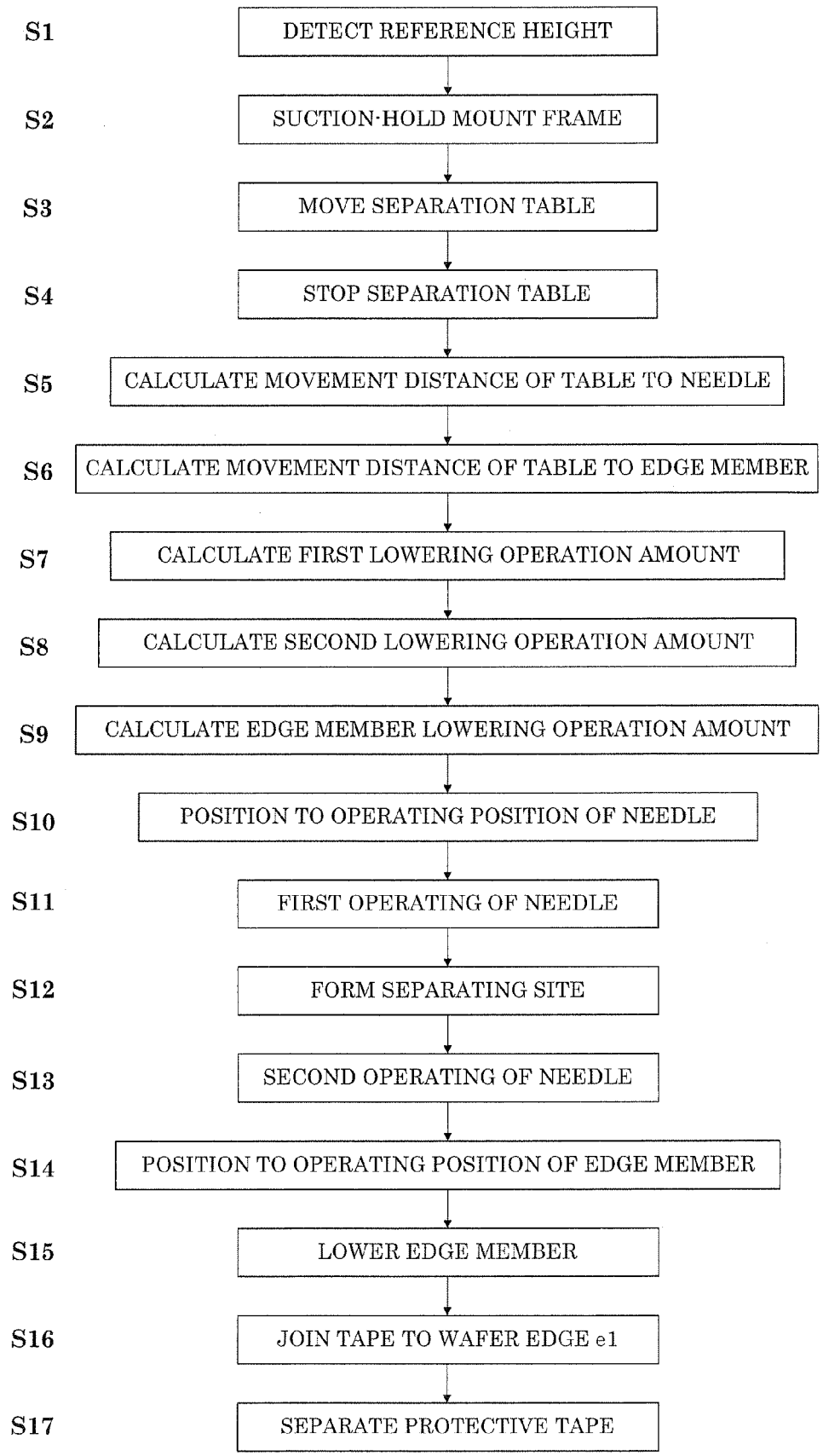
FIG. 17 is a flowchart showing the operation of the separation mechanism.

As shown in FIGS. 15 and 16, the first separation unit 32A is attached and fixed to a vertical wall 60 of the apparatus by way of an outer frame 61. The first separation unit 32A is arranged in the interior of an inner frame 63 lifted by the forward and reverse drive of the motor 62 attached to the upper side of the outer frame 61.

A guide rail 64 disposed horizontally in the front and back direction is arranged on the front side in the horizontal direction (right side in the drawing) of the inner frame 63, and a screw fixed needle 49A and an optical sensor 57 attached by way of a holder 50 to a movable stand 65 supported slidably in the front and back direction along the guide rail 64. The movable stand 65 is configured to be screw fed driven by a screw shaft 67 forward and reversely driven with the pulse motor 66.

The needle 49A has a comb-shape with a plurality of needles being bundled. A non-adhesion coating is performed on the surface of the needle 49A. The needle 49A preferably has a width capable of receiving and holding the adhesion surface of the separation tape Ts, and a width wider than the width of the separation tape Ts is used in the present embodiment. A detection device 57 is attached and fixed to the first separation unit 32A.

The operation of separating the protective tape PT with the first separation unit 32A and the second separation unit 33 of the apparatus of the present embodiment will be described with reference to the flowchart of FIG. 17 and FIGS. 18 to 26.

Prior to mounting the mount frame MF on the separation table 38, the detection device 57 is operated, and the height from the separation table 38 to the detection device 57 is detected. The detection result is retrieved into the control device 58 as a reference height (step S1).

The mount frame MF moves to mount onto the separation table 38 and then suction-holds by thereon (step S2). The separation table 38 with the mount frame MF mounted thereon is moved forward to the lower side of the first separation unit 32A (step S3). In this process, the surface height of the protective tape PT and the adhesion surface of the adhesive tape DT exposed between the ring frame f and the wafer W are distinguished from changes in light intensity of the reflected light when the laser beam projected vertically downward from the detection device 57 is reflected and returned, or the return time until the projected beam is reflected and then the reflected beam is received, and thereby the front end edge of the protective tape PT is detected.

That is, the height of a part where the detection value by the detection device 57 suddenly changes and the position of the separation table 38 at the relevant count time are stored in the control device 58 as positions of wafer edges e1, e2 at both ends (step S4).

The control device 58 first calculates the operating position for forming the separating site on the protective tape PT with the needle 49A. In a case of the present embodiment, the horizontal distance from the tip of the needle 49A to the wafer edge e1 is calculated, and the operating position where the tip of the needle 49A approaches to the wafer edge e1 and the horizontal movement distance thereof are calculated (step S5).

The operating position and the horizontal movement distance of the needle 49A are calculated from the position and the movement distance of the wafer edge e1 detected when scanned by the detection device 57 while moving the separation table 38, and the distance from the wafer edge e1 to the origin position of the needle 49A.

Similarly, the operating position and the horizontal movement distance of the edge member 54 are calculated (step S6). The operating position and the horizontal movement distance of the edge member 54 are calculated from the position and the movement distance of the wafer edge e1 detected when scanned by the detection device 57 while moving the separation table 38, and the distance to the origin position of the edge member 54.

The control device 58 then calculates the lowering operation amount of the needle 49A. In a case of the present embodiment, the needle 49A calculates the two lowering operation amounts at the operating position. Firstly, the lowering operation amount to the separation starting position of the protective tape, and the lowering operation amount to the moving backward position after forming the separating site on the protective tape PT are calculated.

A plurality of height detection values in a predetermined range (e.g., 1 to 20 mm) from the wafer edge e1 that becomes the separation tape joining start side are averaged through calculation with the control device 58 and the resultant average is determined as the surface height of the protective tape. The first lowering operation amount is calculated based on this value and the thickness of the protective tape. In other words, the first lowering operation amount is calculated so as to be a height of the adhesion boundary of the wafer W and the protective tape PT or slightly higher than the adhesion boundary and so that the tip and the bottom surface of the needle 49A do not contact the surface of the wafer W (step S7).

The second lowering operation amount is determined to a value such that the surface height of the adhesive tape DT at the outer periphery of the wafer edge e1 is detected by the detection device 47, and the edge member 54 is accommodated between the surface height of the adhesive tape DT and the surface height of the protective tape PT (step S8).

Similarly, the control device 58 calculates the lowering operation amount of the edge member 54 (step S9). The operation amount of the edge member 54 is obtained using the height of the edge member 54 at the origin position set in advance by subtracting the thickness of the separation tape Ts-wound around the edge member 54 from the surface height of the protective tape PT acquired by averaging.

The lowering operation amount of contacting the separation tape Ts to the surface of the protective tape PT with a predetermined pressing force by lowering the needle 49A and the edge member 54 is determined in the above manner. The control device 58 has a function serving as calculation means of the present invention.

Figure 18:
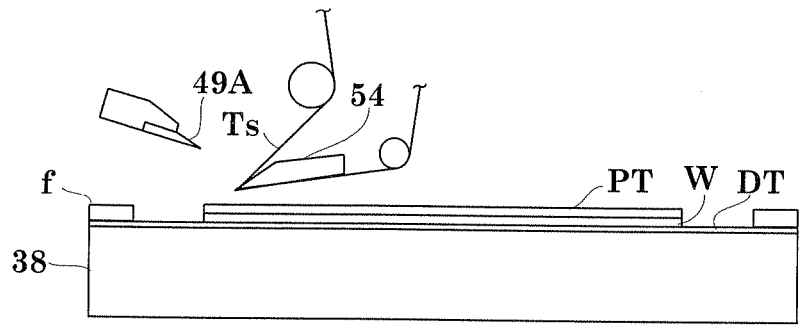
FIGS. 18 to 26 are side views showing the operation process of the separation mechanism.
Figure 19:
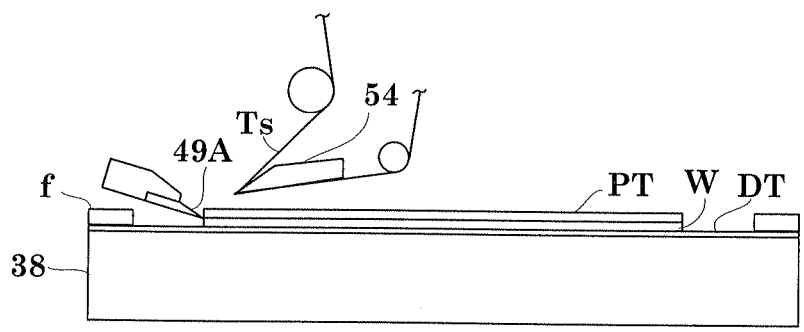

The control device 58 controls a pulse motor 66 based on the calculated horizontal movement distance of the needle 49A, and moves the movable stand 65 so that the tip of the needle 49A arrives to above the operating position closer to the peripheral edge of the protective tape PT, as shown in FIG. 18 (step S10). When arriving above the operating position, the control device 58 operation controls the motor 62 based on the first lowering operation amount, and lowers an inner frame 63 (step S11). That is, as shown in FIG. 19, the control device 58 lowers the needle 49A to a height close to the adhesion boundary of the protective tape PT and the wafer W, which is the operating position where the tip of the needle sticks. The position where the tip of the needle 49A sticks is not limited to the adhesion boundary, and may be an adhesion layer of the protective tape PT. Therefore, the height of lowering the inner frame 64 is appropriately changed depending on the position of sticking the needle 49A to the protective tape PT.

Figure 20:
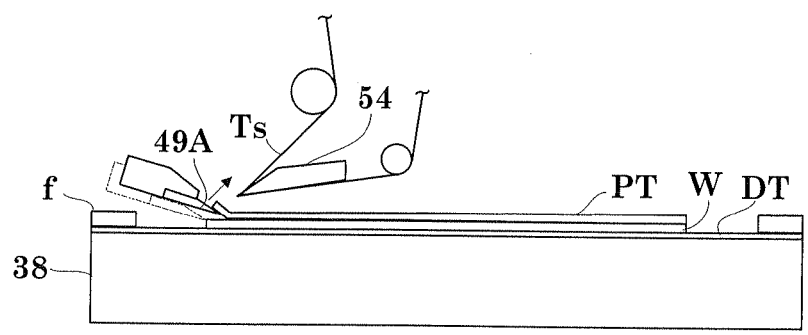

When the tip of the needle 49A arrives at the operating position, the control device 58 operation controls the pulse motor 66 and the motor 62, moves the movable stand 65 forward by a distance defined in advance, and separates one part of the peripheral edge of the protective tape PT while moving the needle 49A diagonally upward to the right in the drawing while sticking the tip of the needle 49A to the adhesion boundary to form the separating site, as shown in FIG. 20 (step S12).

Figure 21:
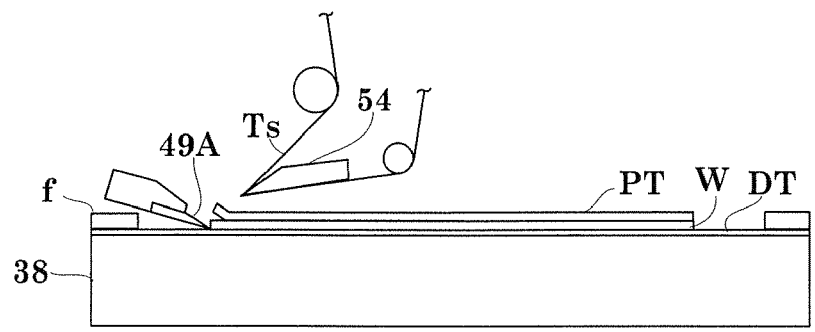

After the formation of the separating site is terminated, the control device 58 reversely drive controls the pulse motor 66, and moves the movable stand 65 backward. That is, the tip of the needle 49A moves backward to the position close to the outer periphery of the wafer. The control device 58 then operation controls the motor 62 based on the second lowering operation amount and lowers the inner frame 63 by a microscopic distance, and stops the inner frame so that the tip of the needle 49A is positioned in a range above the surface height of the adhesive tape DT to the surface height of the wafer. W, as shown in FIG. 21 (step S13).

The control device 58 operates the pulse motor 43 and moves the separation table 38 forward based on the calculated horizontal movement distance of the edge member 54. That is, the forward movement is once stopped automatically when the distal end of the edge member 54 arrives at the inner side than the outer periphery of the after (step S14).

With the forward movement of the separation table 38, the control device 58 operation controls the pulse motor 66 in synchronization with the drive of the pulse motor 43. That is, the separation table 38 moves with the tip of the needle 49A being proximate to the side surface of the wafer W.

Figure 22:
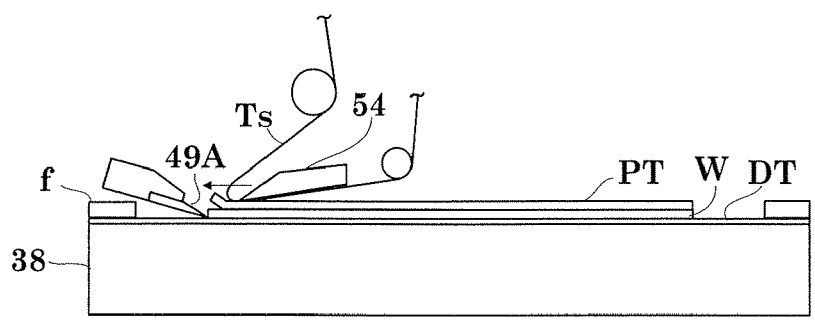
Figure 23:
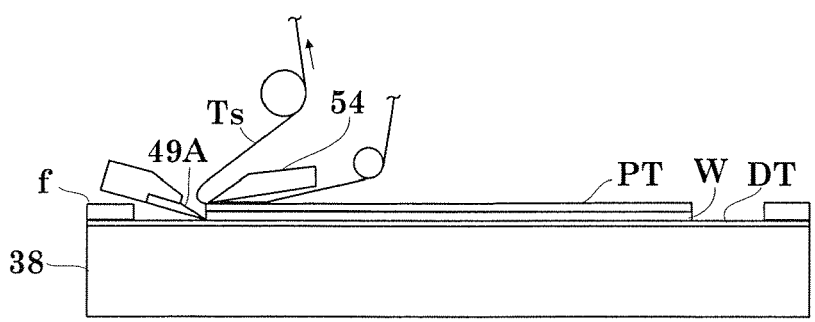

Thereafter, the control device 58 lowers the edge member 54 wound by the separation tape Ts supplied from the tape supply part 31 to a position closer to the center of the wafer, as shown in FIG. 22, based on the calculated lowering operation amount of the edge member 54 (step S15). As shown in FIG. 23, the separation table 38 is then once moved backward, and the separation tape Ts is joined to the separating site of the protective tape PT with the distal end of the edge member 54 while being pressed with a predetermined pressing force (step S16). The control device 58 controls the pulse motor 66 so that the needle 49A moves while maintaining proximate to the side surface of the wafer W in synchronization with the movement of the separation table 38 during the separation operation.

At this time, in a case where the separation tape Ts bulging and bending towards the distal end of the edge member 54 runs out from the outer periphery of the wafer and drops towards the adhesive tape DT on the lower side, the tip of the needle 49A proximate towards the outer periphery of the wafer W receives this a separation tape Ts. The non-adhesion coating is applied on the surface of the needle 49A, and thus the separation tape Ts will not be joined thereto.

Figure 24:
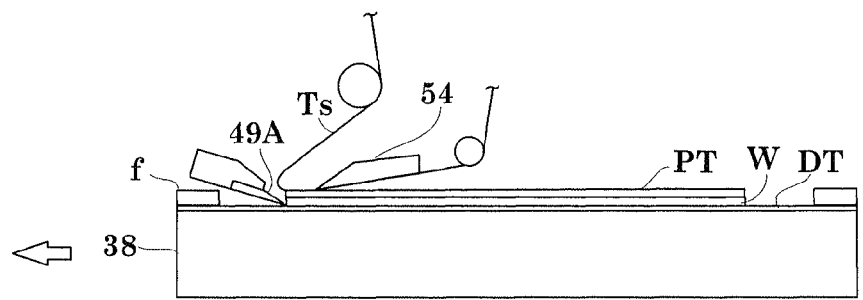
Figure 25:
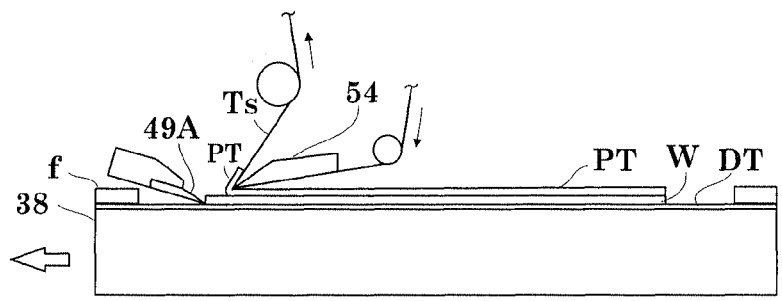
Figure 26:
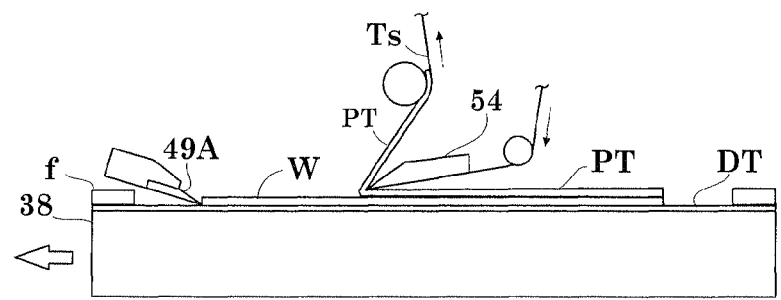

After the joining of the separation tape Ts to the separating site is completed, the separation table 38 starts again to move forward (right side in the drawing) with the separation tape Ts pressed against the protective tape PT with the edge member 54, and the separation tape Ts starts to be wound towards the tape collecting part 34 at a speed tuned with the movement speed, as shown in FIGS. 24 to 26. With this operation, the edge member 54 joins the separation tape Ts to the protective tape PT on the surface of the wafer W while pressing, and at the same time, separates the protective tape PT from the surface of the wafer W while separating the joined separation tape Ts (step S17).

At the time when the pulse motor 43 is controlled so that the edge member 54 moves forward by a distance corresponding to the diameter of the wafer from the lowering operated separation tape joining start position, that is, at the time when the edge member 54 arrives at the back end edge of the protective tape PT and the protective tape PT is completely separated from the surface of the wafer, the edge member 54 is controlled for moving upward and the second separation unit 33 returns to the initial state. The operation of separating the protective tape PT is then terminated.

As described above, even in this embodiment, the excessive load by the pressing force of the needle 49A when separating the protective tape is not applied on the wafer W by detecting the surface height of the protective tape PT to calculate the lowering operation amount of the needle 49A, and controlling the height of the needle 49A at the operating position based on the calculation result, similar to the first embodiment.

The excessive load by the pressing force of the edge member 54 when separating the protective tape is not applied on the wafer W by detecting the surface height of the protective tape PT to calculate the lowering operation amount of the edge member 54, and controlling the height of the edge member 54 at the operating position based on the calculation result. Therefore, the wafer W will not be damaged at any separation time.

After the separating site is formed on the protective tape PT by the needle 49A, the tip of the needle 49A is brought close towards the end of the separating site that becomes the starting point of separation from the outer side of the wafer, so that when the separation tape Ts bends and runs out from the outer periphery of the wafer and drops during the joining of the separation tape Ts, the dropping separation tape Ts can be received. In other words, the adhesion surfaces of the adhesive tape DT and the separation tape Ts are prevented from joining to each other, whereby excess separation stress is not applied on the wafer W when separating the protective tape and the damages of the wafer W can be prevented.

The present invention is not limited to the above-described embodiments, but may be modified and implemented as follows.

(1) In the first embodiment, the tip of the needle 49 is positioned in the vicinity of the peripheral edge of the protective tape PT when the movable block 47 is lowered to the operating position, but the needle 49 may directly stick to the peripheral edge of the protective tape PT. Also in this case, the length of the needle 49 is set such that the tip of the needle 49 does not pass through the protective tape PT and reach the surface of the wafer W. The needle is not limited to one needle 49 in the above-described embodiment and variant, and may be a combination of plural needles 49.

The needle 49 is arranged at the lower end of the movable block 47 so that the tip is perpendicular to the surface of the protective tape PT, but may be attached obliquely towards the front side in the advancing direction of the separation table 38.

Also in the apparatus of the second embodiment, the needle 49A may stick the surface of the protective tape PT so that the tip of the needle 49A does not pass through the protective tape PT and reach the surface of the wafer W.

(2) In the first embodiment, the separation tape Ts is joined to the front surface of the protective tape PT with a constant pressing force after forming the separating site of the protective tape PT with the needle 49, but the pressing force to the separating site is preferably weaker than that to other portion.

In this case, the pulse motors 43, 53 are operation controlled by the control device 58, and the movement of the separation table 38 and the height of the edge member 54 are controlled in a step-wise manner. That is, when moving the separation table 38 by a separating site shown in FIG. 6, the height of the edge member 54 is made higher than that of the protective tape PT other than the separating site to make the pressing force weaker. After arriving at the terminating position of the separating site, the separation table 38 once stops or decelerates, the height of the edge member 54 is further lowered to join the separation tape Ts to the protective tape PT with stronger pressing force. According to this configuration, the separating site can be avoided from again adhering to the wafer W.

Also in the second embodiment, the pressing force to the separating site may be made weaker than that to the other portion.

(3) In each embodiment described above, the edge member 54 is used as a joining member of the separation tape Ts, but a roller may be used. In this case, a roller with hard circumferential surface is preferable, and a roller with a possibly small diameter is preferable.

(4) The separation table 38 is horizontally moved with the needle 49 hooked at the peripheral edge of the protective tape PT, but the outer peripheral portion of the protective tape PT may be separated while moving upward by a microscopic height the first separation unit 32 from where the needle 49 is hooked at the protective tape PT. According to this configuration, the peripheral edge of the protective tape is lifted and separation can be more reliably carried out.

(5) Detecting the end edge of the protective tape PT in a non-contacting manner may be performed based on the analysis of the acquired images with the CCD camera and the.

(6) In each embodiment described above, the mount frame MF may be position fixed, and the first and second separation units 32, 32A, and 33 may be horizontally moved.

(7) In the first embodiment, the needle 49 and the edge member 54 are lowering controlled, but the mount frame MF may move upward with respect to the needle 49 and the edge member 54, which are not lifted.

Also in the apparatus of the second embodiment, the needle 49A and the edge member 54 may be fixed, and only the separation table 38 holding the mount frame MF may be controlled.

(8) In each embodiment described above, a rolled band-shaped tape is fed and used for the separation tape Ts for separating the protective tape PT, but a sheet of an adhesive tape, or an adhesive sheet cut with a predetermined dimension may be used.

(9) In each embodiment, the protective tape PT is separated from the surface of the wafer W lined and supported to the mount frame MF, but application can be made to a case of separating the protective tape from a wafer. W without the mount frame MF.

The present invention may be embodied in other specific forms without departing from the spirit or essential attributes thereof and, accordingly, reference should be made to the appended claims, rather than to the foregoing specification, as indicating the scope of the invention.

What is claimed is:

1. A protective tape separation method for separating a protective tape from a surface of a semiconductor wafer integrally with a separation tape, by joining the separation tape to the protective tape joined to the surface of the semiconductor wafer while pressing a non-adhesion surface of the separation tape with a joining member and separating the separation tape, the method comprising:

a height detecting step of detecting a separation tape joining start position and a surface height of the protective tape joined to the semiconductor wafer mounted and held on a separation table;

a calculating step of calculating a first operation amount of hooking a separation member having a sharp tip to a peripheral edge of the protective tape at the separation tape joining position and moving the separation member until forming a separating site serving as a separation starting point, and a second operation amount of approaching the joining member to the protective tape until the separation tape wound around the joining member contacts the protective tape based on detected information of the surface height of the protective tape;

a first separating step of hooking the separation member to the peripheral edge of the protective tape and separating at least one part of a peripheral edge of the protective tape to form the separating site based on the first operation amount;

a joining step of joining the separation tape to the protective tape by relatively moving the semiconductor wafer and the joining member along a direction of a surface of the protective tape while pressing the separation tape to the protective tape with the joining member based on the second operation amount after moving backward the separation member which has separated the peripheral edge of the protective tape; and a second separating step of separating the separation tape from the surface of the semiconductor wafer integrally with the protective tape by relatively moving the semiconductor wafer and the joining member along the direction of the surface of the protective tape from the separating site as the starting point, wherein the calculating step has an average value of a plurality of detected values in a predetermined range including a wafer edge on a separation tape joining start side of the semiconductor wafer as the surface height of the protective tape in the height detecting step, wherein the calculating step calculates the second operation amount with which the height of the joining member to be contacted to the separating site is higher than the height of the non-separating portion of the protective tape; and wherein the joining step performs joining with the pressing force for joining the separation tape to the separating site separated in the second separating step weaker than that to the non-separating portion of the protective tape based on the second operation amount.

2. The protective tape separation method according to claim 1, wherein the average value obtained in the calculating step is obtained by measuring a distribution of the surface height from the detected value, and excluding a unique value from the distribution.

3. The protective tape separation method according to claim 1, wherein a deviation between a reference value of the surface height of the protective tape determined in advance and an actual measurement value of the surface height of the protective tape obtained from an actual measurement is obtained, and the both operation amounts obtained in the calculating step are corrected according to the deviation.

4. The protective tape separation method according to claim 1, wherein the separation tape is joined to an end of the protective tape on the separation tape joining start side, and the separation tape is joined from the end towards a separation tape joining termination side.

5. The protective tape separation method according to claim 1, wherein the joining member is operated to approach the surface of the protective tape closer to a center of the wafer with respect to the wafer edge on the separation tape joining start side, and join the separation tape towards the wafer edge on the side to start joining of the separation tape while maintaining a height of the joining member; and
the separation tape is joined towards a wafer edge on the separation tape joining termination side while maintaining the height of the joining member.

6. The protective tape separation method according to claim 1, wherein the joining step and the second separating step are simultaneously performed.

7. The protective tape separation method according to claim 1, wherein the first separating step relatively moves the semiconductor wafer and the separation member in opposite directions along the direction of the surface of the protective tape; and
the second separating step relatively moves the semiconductor wafer and the joining member in opposite directions along the direction of the surface of the protective tape from the separating site as the starting point.

8. The protective tape separation method according to claim 1, wherein the separation member is a needle; and
the joining member is an edge member with a sharp distal end.

9. A protective tape separation method for separating a protective tape from a surface of a semiconductor wafer integrally with a separation tape, by joining the separation tape to the protective tape joined to the surface of the semiconductor wafer while pressing a non-adhesion surface of the separation tape with a joining member and separating the separation tape, the method comprising:
a height detecting step of detecting a separation tape joining start position and a surface height of the protective tape joined to the semiconductor wafer mounted and held on a separation table;
a calculating step of calculating a first operation amount of sticking a separation member to a peripheral edge of the protective tape serving as a separation tape joining position and moving the separation member until forming a separating site serving as a separation starting point, and a second operation amount of approaching the joining member to the protective tape until the separation tape wound around the joining member contacts the protective tape based on detected information of the surface height of the protective tape;
a first separating step of sticking the separation member to the peripheral edge of the protective tape and separating one part of the peripheral edge of the protective tape to form the separating site based on the first operation amount;
a joining step of joining the separation tape to the protective tape by relatively moving the semiconductor wafer and the joining member along a direction of a surface of the protective tape while pressing the separation tape to the protective tape with the joining member based on the second operation amount after moving backward the separation member which has separated the end of the protective tape; and
a second separating step of separating the separation tape from the surface of the semiconductor wafer integrally with the protective tape by relatively moving the semiconductor wafer and the joining member along the direction of the surface of the protective tape from the separating site as the starting point,
wherein the calculating step has an average value of a plurality of detected values in a predetermined range including a wafer edge on a separation tape joining start side of the semiconductor wafer as the surface height of the protective tape in the height detecting step,
wherein the calculating step calculates the second operation amount with which the height of the joining member to be contacted to the separating site is higher than the height of the non-separating portion of the protective tape; and
wherein the joining step performs joining with the pressing force for joining the separation tape to the separating site separated in the second separating step weaker than that to the non-separating portion of the protective tape based on the second operation amount.

10. The protective tape separation method according to claim 9, wherein the average value obtained in the calculating step is obtained by measuring a distribution of the surface height from the detected value, and excluding a unique value from the distribution.

11. The protective tape separation method according to claim 9, wherein a deviation between a reference value of the surface height of the protective tape determined in advance and an actual measurement value of the surface height of the protective tape obtained from an actual measurement is obtained, and the operation amounts obtained in the calculating step are corrected according to the deviation.

12. The protective tape separation method according to claim 9, wherein the separation tape is joined to an end of the protective tape on the separation tape joining start side, and the separation tape is joined from the end towards a separation tape joining termination side.

13. The protective tape separation method according to claim 9, wherein the joining member is operated to approach the surface of the protective tape closer to a center of the wafer with respect to the wafer edge on the separation tape joining start side, and join the separation tape towards the wafer edge on the separation tape joining start side while maintaining a height of the joining member; and
the separation tape is joined towards a wafer edge on the separation tape joining termination side while maintaining the height of the joining member.

14. The protective tape separation method according to claim 9, wherein the joining step and the second separating step are simultaneously performed.

15. The protective tape separation method according to claim 9, wherein the first separating step relatively moves the semiconductor wafer and the separation member in opposite directions along the direction of the surface of the protective tape; and
the second separating step relatively moves the semiconductor wafer and the joining member in opposite directions along the direction of the surface of the protective tape from the separating site as the starting point.

16. The protective tape separation method according to claim 9, wherein the separation member is a needle; and
the joining member is an edge member with a sharp distal end.

17. A protective tape separation method for separating a protective tape from a surface of a semiconductor wafer integrally with a separation tape, by joining the separation tape to the protective tape joined to the surface of the semiconductor wafer while pressing a non-adhesion surface of the separation tape with a joining member and separating the separation tape, the method comprising:

a height detecting step of detecting a separation tape joining start position and a surface height of the protective tape joined to the semiconductor wafer mounted and held on a separation table, and a surface height of an outer peripheral portion of the wafer;

a calculating step of calculating a first operation amount of approaching a tapered tip of a separation member having a width equal to or greater than a width of the separation tape and having difficult-to-adhere property to the side surface of the protective tape at the separation tape joining position based on detected information of the surface height of the protective tape and a thickness of the protective tape obtained in advance, a second operation amount of approaching the tip of the separation member to the outer periphery of the wafer while approaching a bottom surface of the separation member to the outer peripheral portion thereof based on the surface height of the outer peripheral portion of the wafer, and a third operation amount of approaching the joining member to the protective tape until the separation tape wound around the joining member contacts the protective tape;

a first separating step of sticking the separation member to an adhesive layer of the protective tape and separating at least one part of a peripheral edge of the protective tape to form a separating site after aligning the separation member based on the first operation amount;

a moving step of moving the separation member to the outer peripheral portion of the wafer based on the second operation amount after moving backward the separation member from the separating site;

a joining step of joining the separation tape to the protective tape by relatively moving the semiconductor wafer and the joining member along a direction of a surface of the protective tape while pressing the separation tape to the protective tape with the joining member from the separating site side of the protective tape based on the third operation amount; and a second separating step of separating the separation tape from the surface of the semiconductor wafer integrally with the protective tape by relatively moving the semiconductor wafer and the joining member along the direction of the surface of the protective tape from the separating site as a starting point, wherein the calculating step has an average value of a plurality of detected values in a predetermined range including a wafer edge on a separation tape joining start side of the semiconductor wafer as the surface height of the protective tape in the height detecting step, wherein the calculating step calculates the third operation amount with which the height of the joining member to be contacted to the separating site is higher than the height of the non-separating portion of the protective tape; and wherein the joining step performs joining with the pressing force for joining the separation tape to the separating site separated in the second separating step weaker than that to the non-separating portion of the protective tape based on the third operation amount.

18. The protective tape separation method according to claim 17, wherein the average value obtained in the calculating step is obtained by measuring a distribution of the surface height from the detected value, and excluding a unique value from the distribution.

19. The protective tape separation method according to claim 17, wherein a deviation between a reference value of the surface height of the protective tape determined in advance and an actual measurement value of the surface height of the protective tape obtained from an actual measurement is obtained, and the first and third operation amounts obtained in the calculating step are corrected according to the deviation.

20. The protective tape separation method according to claim 17, wherein the separation tape is joined to an end of the protective tape on the separation tape joining start side, and the separation tape is joined from the end towards a separation tape joining termination side.

21. The protective tape separation method according to claim 17, wherein the joining member is operated to approach the surface of the protective tape closer to a center of the wafer with respect to the wafer edge on the separation tape joining start side, and join the separation tape towards the wafer edge on the separation tape joining start side while maintaining a height of the joining member; and the separation tape is joined towards a wafer edge on the separation tape joining termination side while maintaining the height of the joining member.

22. The protective tape separation method according to claim 17, wherein the joining step and the second separating step are simultaneously performed.

23. The protective tape separation method according to claim 17, wherein the first separating step relatively moves the semiconductor wafer and the separation member in opposite directions along the direction of the surface of the protective tape; and the second separating step relatively moves the semiconductor wafer and the joining member in opposite directions along the direction of the surface of the protective tape from the separating site as the starting point.

24. The protective tape separation method according to claim 17, wherein the semiconductor wafer is adhered and jointed to a middle of a ring frame by way of adhesive tape.

25. A protective tape separation apparatus for separating a protective tape from a surface of a semiconductor wafer integrally with a separation tape, by joining the separation tape to the protective tape joined to the surface of the semiconductor wafer while pressing a non-adhesion surface of the separation tape with a joining member and separating the separation tape, the apparatus comprising:

a separation table for mounting and holding the semiconductor wafer with the protective tape;

a separation member having a sharp tip directed towards the protective tape joined to the surface of the semiconductor wafer;

first lifting driving means for relatively moving the separation member upward and downward with respect to the separation table between an operating position where the tip works at a peripheral edge of the protective tape joined to the semiconductor wafer held on the separation table and a standby position on an upper side of the operating position;

separation tape supplying means for winding and supplying the band-shaped separation tape to the joining member;

second lifting driving means for relatively moving the joining member upward and downward with respect to the separation table between an operating position of joining the separation tape to the surface of the protective tape joined to the semiconductor wafer held on the separation table and a standby position on an upper side of the operating position;

horizontal driving means for relatively moving the separation table and the separation member, and the separation table and the joining member in opposite directions;

a detector for detecting a separation tape joining start position and a surface height of the protective tape joined to the semiconductor wafer held on the separation table;

calculating means for calculating a first operation amount to the operating position of working the tip of the separation member at the peripheral edge of the protective tape at the separation tape joining start position and forming a separation starting point, and a second operation amount to the operating position of approaching the separation tape wound around the joining member to the protective tape based on detected information of the surface height of the protective tape;

controlling means for controlling the respective driving means so as to lift the separation member to the operating position by the first lifting driving means based on the first operation amount calculated by the calculating means, relatively move the separation member and the separation table at the operating position in opposite directions by the horizontal driving means to separate one part of the peripheral edge of the protective tape, move backward the separation member to a standby position by the first lifting driving means, and thereafter, move the joining member to the operating position by the second lifting driving means, relatively move the joining member and the separation table in opposite directions by the horizontal driving means, and simultaneously separate the separation tape while joining to the protective tape; and tape collecting means for collecting the protective tape integrally with the separated separation tape, wherein a plurality of detected values in a predetermined range from a wafer edge that becomes a separation tape joining start side are averaged by the calculating means, wherein the calculating step calculates the second operation amount with which the height of the joining member to be contacted to a separating site formed by the separation member is higher than the height of the non-separating portion of the protective tape; and wherein the controlling means controls the first lifting driving means and joins with the pressing force for joining the separation tape to a separating site weaker than that to the non-separating portion of the protective tape.

26. The protective tape separation apparatus according to claim 25, wherein the separation member is configured by a needle; and the joining member is configured by an edge member with a sharp distal end.

27. The protective tape separation apparatus according to claim 25, wherein the separation member has a tapered tip having a width equal to or greater than a width of the separation tape and has difficult-to-adhere property;

the calculating means calculates a third operation amount to the operating position of approaching the tip of the separation member to the outer periphery of the wafer while approaching a bottom surface of the separation member to the outer peripheral portion thereof based on the surface height of the outer peripheral portion of the wafer; and the controlling means forms a separating site in the protective tape with the separation member, and moves the separation member to the operating position by controlling the horizontal driving means and the first driving means based on the third operation amount.

* * * * *